(12) United States Patent
Hatori et al.

(10) Patent No.: US 10,615,569 B2
(45) Date of Patent: Apr. 7, 2020

(54) SEMICONDUCTOR LASER WITH EXTERNAL RESONATOR

(71) Applicant: Showa Optronics Co., Ltd., Tokyo (JP)

(72) Inventors: Masami Hatori, Kanagawa (JP); Kenji Ohara, Kanagawa (JP); Takuya Arichi, Kanagawa (JP)

(73) Assignee: SHOWA OPTRONICS CO., LTD., Setagaya-ku, Tokyo (JP)

( * ) Notice: Subject to any disclaimer, the term of this patent is extended or adjusted under 35 U.S.C. 154(b) by 0 days.

(21) Appl. No.: 15/426,289

(22) Filed: Feb. 7, 2017

(65) Prior Publication Data

US 2017/0229842 A1    Aug. 10, 2017

(30) Foreign Application Priority Data

Feb. 10, 2016  (JP) ................................. 2016-023727
Jan. 25, 2017  (JP) ................................. 2017-010835
Feb. 3, 2017   (JP) ................................. 2017-018644

(51) Int. Cl.
*H01S 5/042*  (2006.01)
*H01S 5/14*   (2006.01)
(Continued)

(52) U.S. Cl.
CPC .......... *H01S 5/0427* (2013.01); *H01S 5/0652* (2013.01); *H01S 5/141* (2013.01);
(Continued)

(58) Field of Classification Search
CPC ....................................................... H01S 5/141
See application file for complete search history.

(56) References Cited

U.S. PATENT DOCUMENTS 5,555,253 A * 9/1996 Dixon ..................... H01S 5/141
                                                         372/100
5,943,349 A     8/1999 Ohta
                (Continued)

FOREIGN PATENT DOCUMENTS

JP    11-17286 A      1/1999
JP    2001-242500 A   9/2001

*Primary Examiner* — Tod T Van Roy
(74) *Attorney, Agent, or Firm* — Sughrue Mion, PLLC

(57) ABSTRACT

A semiconductor laser device with external resonator with stable longitudinal mode regardless of variation of drive current is disclosed. The device includes: a semiconductor light-emitting element having a pair of end faces with a light emitting section disposed therebetween, and an external resonator configured to oscillate light emitted from the semiconductor light-emitting element, the external resonator being formed by a resonator mirror disposed outside the semiconductor light-emitting element and one of the pair of end faces that is farther from the resonator mirror, wherein, as the semiconductor light-emitting element, a semiconductor light-emitting element having a structure which does not oscillate light emitted therefrom by itself is used. The device further includes a wavelength control element disposed in the optical path within the external resonator and configured to select a wavelength range of the light, and a driver circuit configured to perform fast modulation drive of the semiconductor light-emitting element.

21 Claims, 29 Drawing Sheets

(51) Int. Cl.
*H01S 5/065* (2006.01)
*H01S 5/028* (2006.01)
*H01S 5/323* (2006.01)

(52) U.S. Cl.
CPC ........... *H01S 5/0287* (2013.01); *H01S 5/0428* (2013.01); *H01S 5/32341* (2013.01)

(56) References Cited

U.S. PATENT DOCUMENTS

| | | | |
|---|---|---|---|
| 9,488,464 B1* | 11/2016 | Schmitt | G01B 9/02004 |
| 2001/0019563 A1 | 9/2001 | Hatori | |
| 2015/0085891 A1* | 3/2015 | Watanabe | H01S 5/141 372/50.11 |

* cited by examiner

201

202

203

204

205

206

301

302

303

304

305

306

307

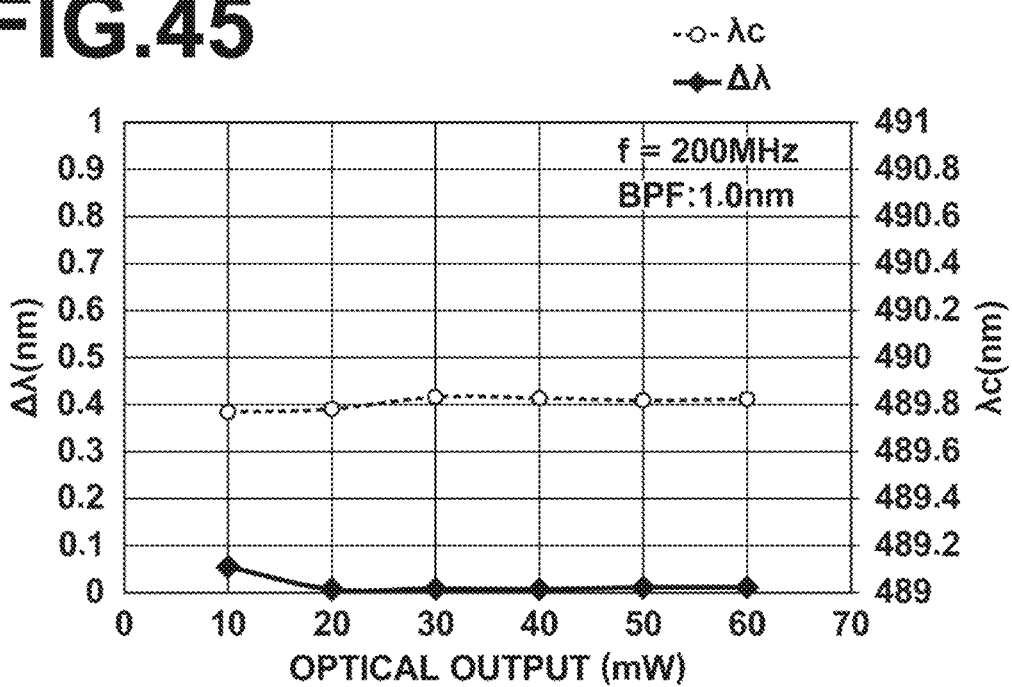

SEMICONDUCTOR LASER WITH EXTERNAL RESONATOR

BACKGROUND

The present disclosure relates to a semiconductor laser device, and more particularly to a semiconductor laser device with external resonator, which includes a semiconductor light-emitting element which does not oscillate light by itself, and an external resonator configured to oscillate light emitted from the semiconductor light-emitting element.

Conventionally, semiconductor laser devices are widely used as a recording light source for various image recording devices and a measuring light source for various measurement devices, for example. As one type of such semiconductor laser devices, semiconductor laser devices that include a semiconductor laser and an external resonator configured to select the wavelength of laser light emitted from the semiconductor laser to be returned to the semiconductor laser are known, as taught in Japanese Unexamined Patent Publication No. 2001-242500 (Patent Document 1), for example. In this type of semiconductor laser devices, a resonator structure of the semiconductor laser that oscillates light by itself and the external resonator form a so-called composite resonator.

In some of the above-described type of semiconductor laser devices, the wavelength of the laser light within a desired wavelength range is selected using a wavelength control element, which is formed by a narrow-band band pass filter, or the like, and is disposed in the optical path of the external resonator. Further, with this type of semiconductor laser devices, fast modulation drive of the semiconductor laser is performed by supplying a drive current with a high-frequency wave superimposed thereon, for example, to the semiconductor laser. Patent Document 1 also teaches that the wavelength is selected using a wavelength control element (which is referred to as "wavelength selecting element" in Patent Document 1), and that fast modulation drive of the semiconductor laser is performed.

On the other hand, as another type of semiconductor laser devices with external resonator; a semiconductor laser device that includes a semiconductor light-emitting element which does not oscillate light by itself, and an external resonator configured to oscillate light emitted from the semiconductor light-emitting element is known, as taught in Japanese Unexamined Patent Publication No. H11 (1999)-17286 (Patent Document 2), for example. It should be noted that the semiconductor light-emitting element is referred to as "laser diode" in Patent Document 2.

Also, in this type of semiconductor laser devices, the wavelength of laser light within a desired wavelength range to be oscillated is selected using a wavelength control element which is formed by a narrow-band band pass filter, or the like, and is disposed in the optical path of the external resonator. Patent Document 2 also teaches about the selection of the wavelength.

Patent Document 1 teaches that, in the case where the wavelength control element is disposed in the external resonator that forms the composite resonator and the fast modulation drive of the semiconductor laser is performed, the longitudinal mode of the laser light emitted from the semiconductor laser device becomes multi-mode. In contrast, in the case where the wavelength control element is disposed in the external resonator, which is the only resonator, as taught in Patent Document 2, it is believed that the longitudinal mode of the laser light emitted from the semiconductor laser device usually becomes single mode. Actually, Patent Document 2 teaches that the wavelength of the laser light can be varied by rotating the band pass filter; however, it does not particularly teach or suggest that multiple wavelengths are present simultaneously.

SUMMARY

In the case where a semiconductor laser device is applied to various measurement devices or testing devices, it is required that the semiconductor laser device achieves particularly stable lasing. Namely, if lasing of the semiconductor laser device is unstable, the lasing wavelength is varied by slight light returned from end faces of optical components, such as end faces of a lens, and the output power of the semiconductor laser device abruptly changes at that time. Such a semiconductor laser device with varying wavelength of the laser light is not suitable for measurement or testing of wavelength-dependent objects. Further, such a semiconductor laser device with varying output power of the laser light is disadvantageous for ensuring high accuracy of measurement or testing.

Conventional semiconductor laser devices with external resonator, however, are hardly considered as having particularly stable lasing. Now, this point is described in detail.

First, a semiconductor laser device with external resonator of the type taught in Patent Document 1 has a mode where the semiconductor laser oscillates light by itself and a mode where the light from the semiconductor laser is oscillated by the external resonator, and the lasing wavelength becomes unstable when a drive current supplied to the semiconductor laser is increased or decreased. This is believed to be due to mode hopping of the Fabry-Perot mode of the semiconductor laser along with increase or decrease of the drive current.

Further, a semiconductor laser device with external resonator of the type taught in Patent Document 2 has a structure where the lasing mode is not controlled by the external resonator, and thus may suffer the following problems. Namely, with this type of semiconductor laser device, even when the drive current and the temperature are controlled to be constant (for example, the temperature is controlled within an acceptable error of $0.01°$ C.) and the resonator length of the external resonator, which is several ten millimeters, is kept constant, the semiconductor laser has a very wide wavelength width within which it can oscillates light, and it is difficult to reliably control the lasing wavelength and maintain stable lasing during long time operation, since the lasing wavelength may change or the longitudinal mode may change from single mode to multi-mode.

In view of the above-described circumstances, the present disclosure is directed to providing a semiconductor laser device with external resonator that can achieve stable longitudinal-mode lasing and stable lasing wavelength even when the drive current varies.

One aspect of the semiconductor laser device with external resonator according to the disclosure comprises:

a semiconductor light-emitting element having a pair of end faces with a light emitting section disposed therebetween, the semiconductor light-emitting element having a structure which does not oscillate light emitted therefrom by itself;

an external resonator comprising a resonator mirror disposed outside the semiconductor light-emitting element and one of the pair of end faces that is farther from the resonator mirror, the external resonator being configured to oscillate the light emitted from the semiconductor light-emitting element;

a wavelength control element disposed in the optical path within the external resonator, and configured to select a wavelength range of the light; and a driver circuit configured to perform fast modulation drive of the semiconductor light-emitting element.

Another aspect of the semiconductor laser device with external resonator according to the disclosure comprises:

a semiconductor light-emitting element having a pair of end faces with a light emitting section disposed therebetween;

an external resonator comprising a resonator mirror disposed outside the semiconductor light-emitting element and one of the pair of end faces that is farther from the resonator mirror, the external resonator being configured to oscillate the light emitted from the semiconductor light-emitting element;

a confocal optical system disposed in the optical path of the external resonator, and configured to focus the light on the other of the pair of end faces that is nearer to the resonator mirror, and on a reflecting surface of the resonator mirror;

a wavelength control element disposed in the optical path within the external resonator, and configured to select a wavelength range of the light; and a driver circuit configured to perform fast modulation drive of the semiconductor light-emitting element.

It should be noted that, in this aspect of the semiconductor laser device with external resonator, the semiconductor light-emitting element may comprise a semiconductor light-emitting element having a structure which oscillates the light emitted therefrom by itself. However, this is not intended to limit the disclosure, and the semiconductor light-emitting element may comprise a semiconductor light-emitting element having a structure which does not oscillate the light emitted therefrom by itself.

It should be noted that the "fast modulation" as used herein refers to modulation where the modulation frequency is not less than 20 MHz and not more than 500 MHz. The frequency of the fast modulation is more preferably not less than 100 MHz and not more than 500 MHz, and even more preferably not less than 200 MHz and not more than 500 MHz.

As the driver circuit, a circuit configured to apply a drive current to the semiconductor light-emitting element, the drive current comprising a direct current with a high-frequency wave superimposed thereon, for example, is preferably used.

Alternatively, as the driver circuit, a circuit configured to apply a pulsed drive current with alternately repeating on-periods and off-periods to the semiconductor light-emitting element may also be preferably used.

It is desirable that the semiconductor laser device with external resonator of the disclosure further comprise an external modulation circuit configured to control an amount of light emission of the semiconductor light-emitting element based on an external modulation signal, wherein a modulation frequency of the fast modulation be set to be twice or more a frequency of the external modulation signal.

As the wavelength control element, a transmission narrow band pass filter, for example, is preferably used; however, this is not limiting, and a transmissive wavelength control element comprising a prism may also be used preferably. As a specific example of the wavelength control element comprising a prism, an anamorphic prism pair is preferably used.

However, this is not intended to limit the disclosure, and a reflection-type wavelength control element, such as a diffraction grating, may be used. In the case where such a reflection-type wavelength control element is used, the wavelength control element often serves as the resonator mirror. The above description that the wavelength control element "is disposed in the optical path within the external resonator" is intended to encompass the case where the wavelength control element also serves as the resonator mirror.

As the semiconductor light-emitting element, a nitride semiconductor light-emitting element configured to emit light of a wavelength in the range from 370 nm to 530 nm is preferably used.

As described above, the semiconductor laser device with external resonator of the one aspect according to the disclosure is in the form of the semiconductor laser device with external resonator of the type taught in Patent Document 1 to which a semiconductor light-emitting element which does not oscillate light by itself is applied, in place of the semiconductor laser that oscillates light by itself. Conventionally, a semiconductor laser device with external resonator having such a configuration has not been proposed. The reason of this is believed that, as described previously, both the semiconductor laser devices with external resonator of the types taught in Patent Document 1 and Patent Document 2 share the same problem of unstable lasing mode. That is, conventionally, it has been common technical knowledge among those skilled in the art to avoid combining these types, which tend to have unstable lasing mode, in order to achieve highly stable lasing mode.

However, the present inventors have found that combining the above-described types can unexpectedly provide a semiconductor laser device with external resonator with highly stable lasing mode regardless of increase or decrease of the drive current, defying the conventional technical knowledge. How the lasing mode is stabilized will be specifically described below in conjunction with embodiments.

On the other hand, it has been found that the other aspect of the semiconductor laser device with external resonator according to the disclosure can also provide highly stable lasing mode regardless of increase or decrease of the drive current. This aspect of the semiconductor laser device with external resonator according to the disclosure includes a confocal optical system configured to focus the light on the reflecting surface of the resonator mirror, where the focal position changes depending on the wavelength of the light, which results in stronger resonation of light of a specific wavelength. That is, the confocal optical system also works to select the wavelength range of light to resonate, similarly to the wavelength control element.

BRIEF DESCRIPTION OF THE DRAWINGS

FIG. 45 is a graph showing the relationship among optical output, center wavelength, and wavelength width of output light when the device shown in FIG. 42 was driven with different drive currents.

DETAILED DESCRIPTION OF THE PREFERRED EMBODIMENTS

Hereinafter, embodiments of a semiconductor laser device with external resonator according to the present disclosure will be described in detail with reference to the drawings.

First Embodiment

Figure 1:
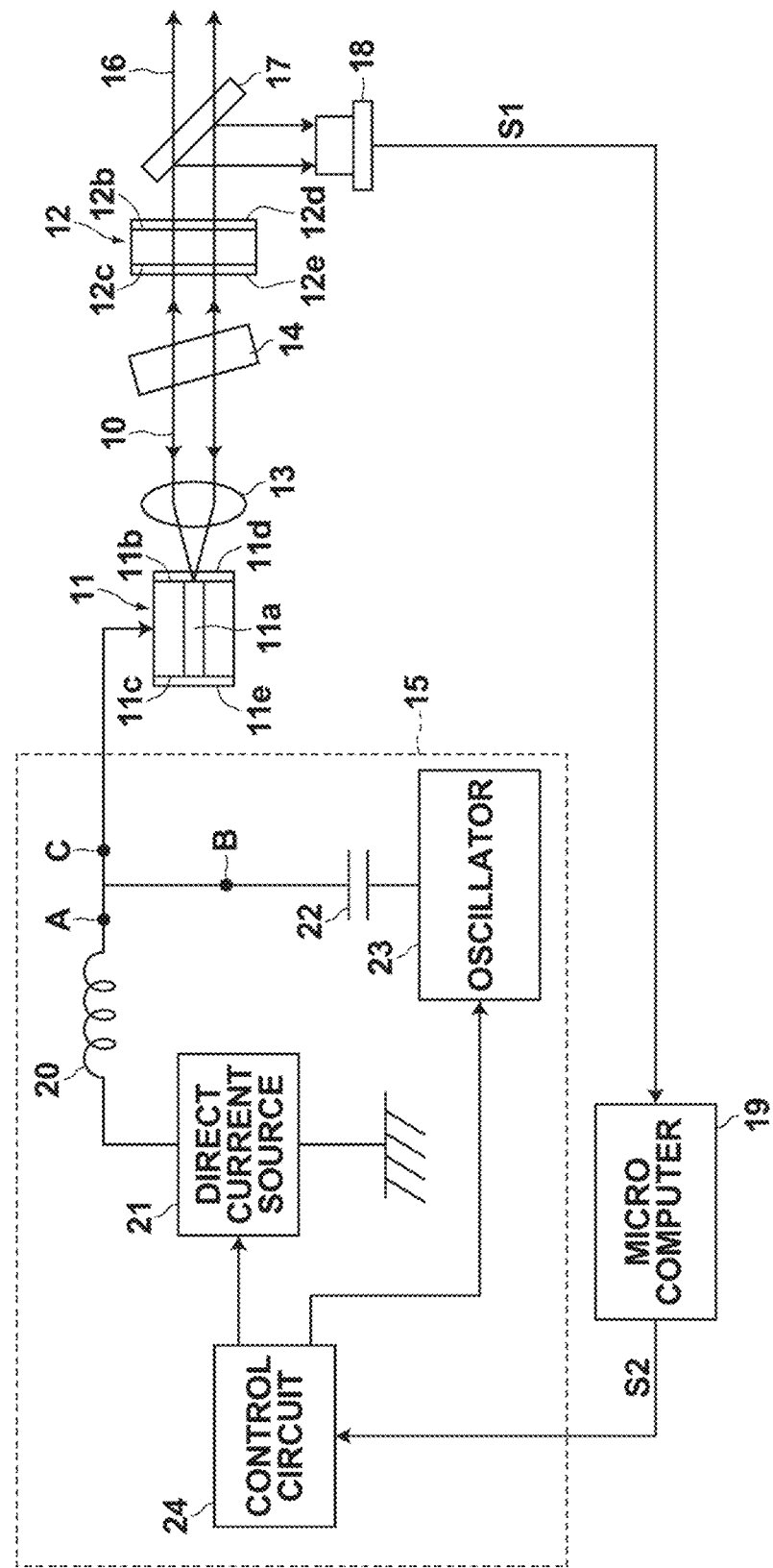
FIG. 1 is a diagram illustrating the schematic configuration of a semiconductor laser device with external resonator according to a first embodiment of the disclosure.

FIG. 1 is a diagram illustrating the schematic configuration of a semiconductor laser device with external resonator 1 according to a first embodiment of the disclosure. As shown, the semiconductor laser device with external resonator 1 of this embodiment basically includes a semiconductor light-emitting element 11 configured to emit light 10, a resonator mirror 12, a collimator lens 13 disposed between the semiconductor light-emitting element 11 and the resonator mirror 12, a narrow band pass filter 14 serving as a wavelength control element disposed between the collimator lens 13 and the resonator mirror 12, and a driver circuit 15 configured to drive the semiconductor light-emitting element 11.

Further, in the optical path of output light 16 outgoing from the resonator mirror 12, a beam splitter 17 configured to partially reflect and branch the output light 16 is disposed. The branched part of the output light 16 enters a photodetector 18, which is formed by a photodiode, for example, and the amount of light of the output light 16 is detected. The photodetector 18 outputs a light amount detection signal S1 indicating the detected amount of light, and the light amount detection signal S1 is inputted to a microcomputer 19.

The semiconductor light-emitting element 11 is formed, as one example, by a laser diode. This laser diode is configured as described later, and does not oscillate light by itself; however, the semiconductor layer structure thereof as a light-emitting element is basically the same as a usual laser diode, and thus is referred to herein as "laser diode". In this embodiment, a laser diode formed by a nitride semiconductor, i.e., a GaN-based compound semiconductor, which emits the light 10 having a wavelength around 488 nm is applied, as one example.

This semiconductor light-emitting element 11 includes an optical waveguide 11a in the form of a channel serving as the light emitting section, a front end face 11b including one of end faces of the optical waveguide 11a, and a rear end face 11c including the other of the end faces of the optical waveguide 11a. The front end face 11b is provided with a non-reflection coating 11d having a reflectance of substantially 0% to the wavelength of the light 10 emitted from the semiconductor light-emitting element 11. On the other hand, the rear end face 11c is provided with a high-reflection coating 11e having a reflectance of 99.9% or more to the wavelength of the light 10.

As described above, in the semiconductor light-emitting element 11, the front end face 11b, which is one of the pair of end faces 11b and 11c sandwiching the optical waveguide 11a serving as the light emitting section, is provided with the non-reflection coating 11d, and thus the light 10 does not resonate between the end faces 11b and 11c. Thus, the semiconductor light-emitting element 11 which does not oscillate light by itself is provided.

On the other hand, the resonator mirror 12 includes a front end face 12b (the end face opposite from the side where the semiconductor light-emitting element 11 is disposed) and a rear end face 12c. The front end face 12b is provided with a non-reflection coating 12d having a reflectance of substantially 0% to the above-described wavelength. On the other hand, the rear end face 12c is provided with a partial reflection coating 12e having a reflectance of around 65% to the above-described wavelength.

With the semiconductor light-emitting element 11 and the resonator mirror 12 having the structures as described above, the rear end face 11c (the end face farther from the resonator mirror 12) of the semiconductor light-emitting element 11 and the rear end face 12c of the resonator mirror 12 form an external resonator for resonating the light 10 emitted from the semiconductor light-emitting element 11.

Figure 2:
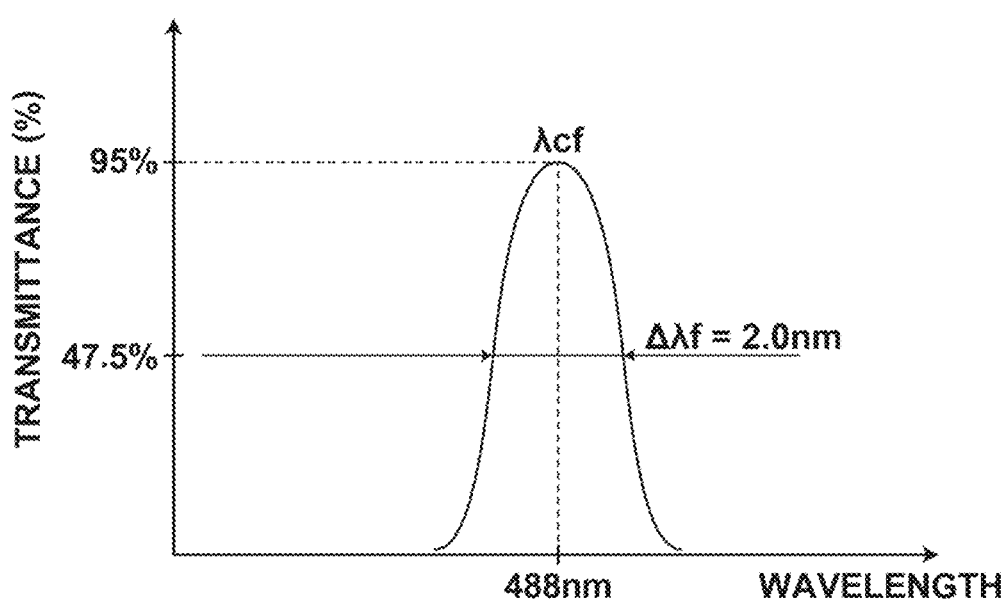
FIG. 2 is a graph showing transmission characteristics of a narrow band pass filter employed in the device of FIG. 1.

The narrow band pass filter 14 selects and transmits only light within a predetermined narrow wavelength range from the light 10 emitted from the semiconductor light-emitting element 11. One example of transmission characteristics of the narrow band pass filter 14 is shown in FIG. 2. With the characteristics shown, where a transmission center wavelength λcf=488 nm, and a transmission width Δλf (represented by the full width at half maximum (FWHM))=2.0 nm, the transmission center wavelength λcf can be changed, as described later.

The driver circuit 15 includes a direct current source 21 for supplying a direct current to the semiconductor light-emitting element 11 via a coil 20, an oscillator 23 connected between the coil 20 and the semiconductor light-emitting element 11 via a capacitor 22, and a control circuit 24. The control circuit 24 controls operation of the direct current source 21 and the oscillator 23 based on a control signal S2 outputted from the microcomputer 19.

Now, operation of the semiconductor laser device with external resonator 1 having the above-described configuration is described. The direct current source 21 outputs a direct current of a predetermined value. The schematic waveform of the direct current flowing through a point A shown in FIG. 1 is shown at A in FIG. 3. Also, a high-frequency wave current having a sinusoidal waveform having a frequency within the range of about 100 MHz to 350 MHz, as one example, is outputted from the oscillator 23. The schematic waveform of the high-frequency wave current flowing through a point B shown in FIG. 1 is shown at B in FIG. 3. The high-frequency wave current passes through the capacitor 22, and then is superimposed on the direct current that has passed through the coil 20. Accordingly, a drive current with the high-frequency wave current superimposed thereon is applied to the semiconductor light-emitting element 11. The schematic waveform of the drive current flowing through a point C shown in FIG. 1 is shown at C in FIG. 3.

The semiconductor light-emitting element 11 receives the drive current and emits the light 10 in the form of divergent light. The light 10 is collimated by the collimator lens 13 and is transmitted through the narrow band pass filter 14 to enter the resonator mirror 12. As described previously, the light 10 resonates in the external resonator that is formed by the rear end face 11c of the semiconductor light-emitting element 11 and the rear end face 12c of the resonator mirror 12. In this manner, energy within the resonator is increased to achieve stimulated emission in the semiconductor light-emitting element 11 to obtain laser light. A part of the laser light is transmitted through the resonator mirror 12 and is extracted from the resonator as output light 16.

Figure 3:
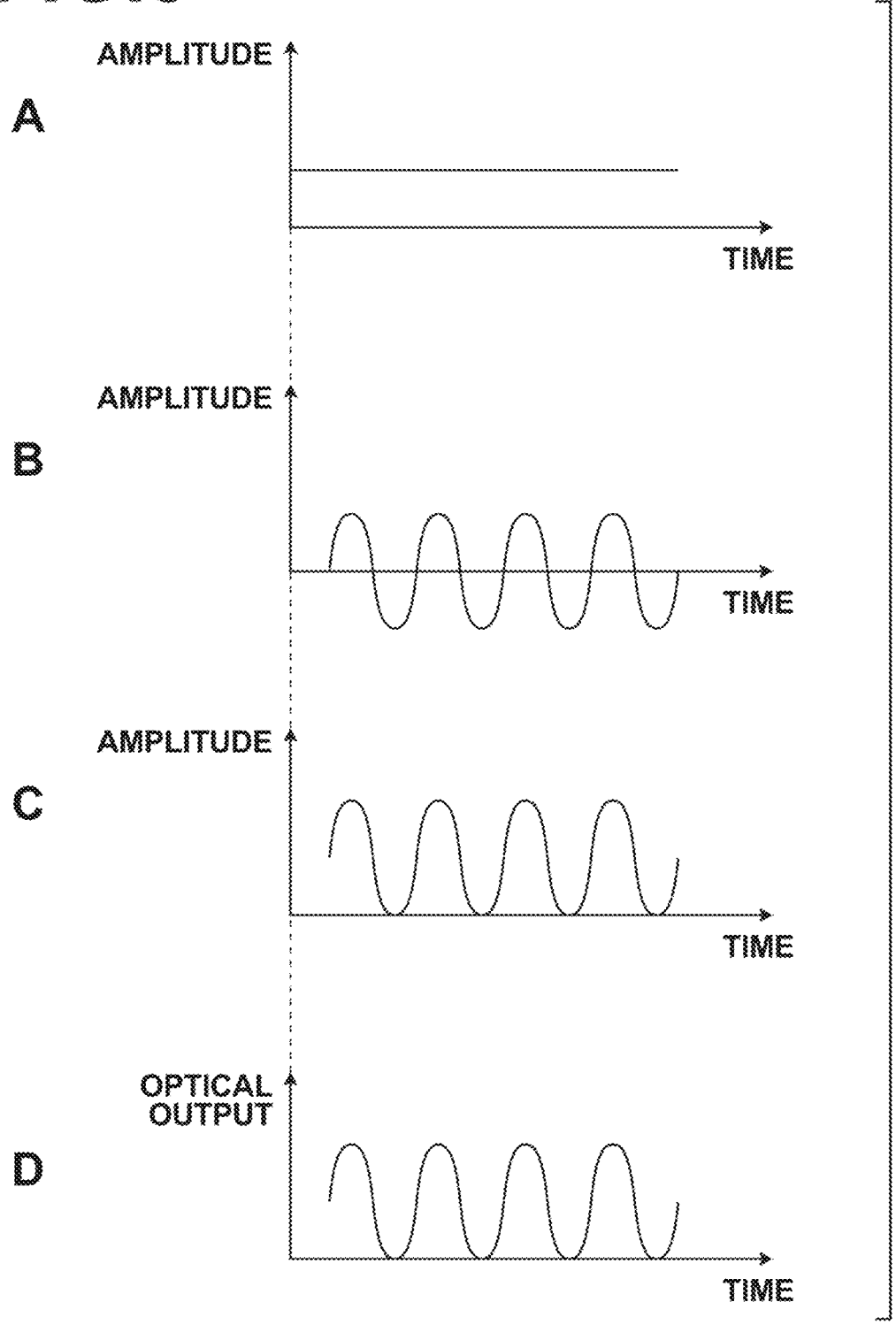
FIG. 3 shows waveform charts (A to C) of current at each point and a waveform chart (D) of output light of the device of FIG. 1.

The schematic waveform of the output light 16, which is laser light, is shown at D in FIG. 3. As shown, optical output of the output light 16 periodically increases and decreases correspondingly to the drive current with the high-frequency wave superimposed thereon, as described previously, of the semiconductor light-emitting element 11. Thus, fast modulation drive of the semiconductor light-emitting element 11 is achieved. It should be noted that the optical output waveform of the output light 16 shown at D in FIG. 3 is basically the same as the drive current waveform shown at C in FIG. 3. More precisely, the optical output waveform of the output light 16 also reflects the optical output characteristics of the semiconductor light-emitting element 11, and therefore it does not strictly coincide with the drive current waveform; however, it is shown as being the same in FIG. 3.

A part of the output light 16 is reflected and branched at the beam splitter 17, and the remaining part of the output light 16 is transmitted through the beam splitter 17 to be used. It should be noted that the reflectance of the beam splitter 17 may be, but not limited to, around 10%. The branched output light 16 enters the photodetector 18 and the amount of light thereof is detected by the photodetector 18. The light amount detection signal S1 outputted from the photodetector 18 is inputted to the microcomputer 19. The microcomputer 19 controls operation of the control circuit 24 based on the light amount detection signal S1. Namely, the operation of the control circuit 24 is controlled such that, if the light amount detection signal S1 is greater than a set value (i.e., if the detected amount of light is greater than a target value), value of the direct current outputted from the direct current source 21 is decreased, and, if the light amount detection signal S1 is smaller than the set value (i.e., if the detected amount of light is smaller than the target value), value of the direct current outputted from the direct current source 21 is increased. This allows maintaining the optical output (average) of the output light 16 at a desired fixed value.

The wavelength of the output light 16, which is the laser light, is selected by the narrow band pass filter 14. Namely, in this embodiment, the wavelength of the light 10 is selected by the narrow band pass filter 14 having the transmission characteristics as shown in FIG. 2, and the light 10 of the selected wavelength is fed back from the external resonator to the semiconductor light-emitting element 11. This allows limiting the wavelength of the oscillated light 10, i.e., the output light 16, to a relatively narrow range.

The transmission characteristics of the narrow band pass filter 14 can be changed by rotating the narrow band pass filter 14, which is disposed obliquely to the optical axis within the external resonator, in a direction in which the incidence angle relative to the optical axis changes. Changing the transmission characteristics of the narrow band pass filter 14 in this manner to change the wavelength selected by the narrow band pass filter 14 allows setting the wavelength of the output light 16 at a desired value. It should be noted that, after the narrow band pass filter 14 is rotated, as described above, the position of the narrow band pass filter 14 can be fixed such that it cannot rotate to stabilize the wavelength of the output light 16.

Next, advantageous effects of the semiconductor laser device with external resonator 1 of this embodiment are described. In order to confirm the advantageous effects, a semiconductor laser device with external resonator having the specifications below according to this embodiment was produced. This semiconductor laser device is hereinafter referred to as Example 1.

Example 1

(1) Specifications of the Semiconductor Light-Emitting Element 11
Band where gain is present: 470 nm to 495 nm
Reflectance of the front end face 11b: substantially 0%
Reflectance of the rear end face 11c: 99.9% or more
(2) Specifications of the Resonator Mirror 12
Reflectance of the front end face 12b: substantially 0%
Reflectance of the rear end face 12c: 65.0%
(3) Specifications of the Narrow Band Pass Filter 14
Transmission characteristics: basically as shown in FIG. 2; however, the transmission center wavelength $\lambda cf$ is changeable by rotating the narrow band pass filter 14
(4) Specifications of the Beam Splitter 17
reflectance: 10.0%
(5) Drive Current of the Semiconductor Light-Emitting Element 11
direct current with high-frequency wave superimposed thereon; frequency of the high-frequency wave=100 MHz Further, for comparison with the semiconductor laser device with external resonator 1 of Example 1, semiconductor laser devices with external resonator of Comparative Examples 1 to 4 were produced. Major features of Comparative Examples 1 to 4 are shown in Table 1 in comparison with the features of semiconductor laser device with external resonator 1.

TABLE 1

| Item | Example 1 | Comp. 1 | Comp. 2 | Comp. 3 | Comp. 4 |
| --- | --- | --- | --- | --- | --- |
| Drive | high frequency wave superimposed | DC | high frequency wave superimposed | high frequency wave superimposed | DC |
| Wavelength Control Element | BPF | none | none | prism | BPF |
| External Resonator | provided | none | none | provided | provided |

It should be noted that features of Comparative Examples 1 to 4 other than those shown in Table 1 were basically the same as those of the semiconductor laser device with external resonator 1 of Example 1. In Table 1, the description "DC" in the column of "Drive" indicates that the semiconductor light-emitting element 11 was driven with a direct current without a high-frequency wave superimposed thereon. The description "none" in the column of "Wavelength Control Element" indicates that no wavelength control element for selecting the wavelength was provided, the description "BPF" indicates that a narrow band pass filter was applied as the wavelength control element for selecting the wavelength, and the description "prism" indicates that an anamorphic prism pair was applied as the wavelength control element for selecting the wavelength. It should be noted that the selection of the wavelength of laser light using the anamorphic prism pair is described in Japanese Unexamined Patent Publication No. 2015-56469, for example. Further, the description "none" in the column of "External Resonator" indicates that no external resonator was provided and a laser diode that can oscillate light by itself was used as the semiconductor light-emitting element.

Figure 4:
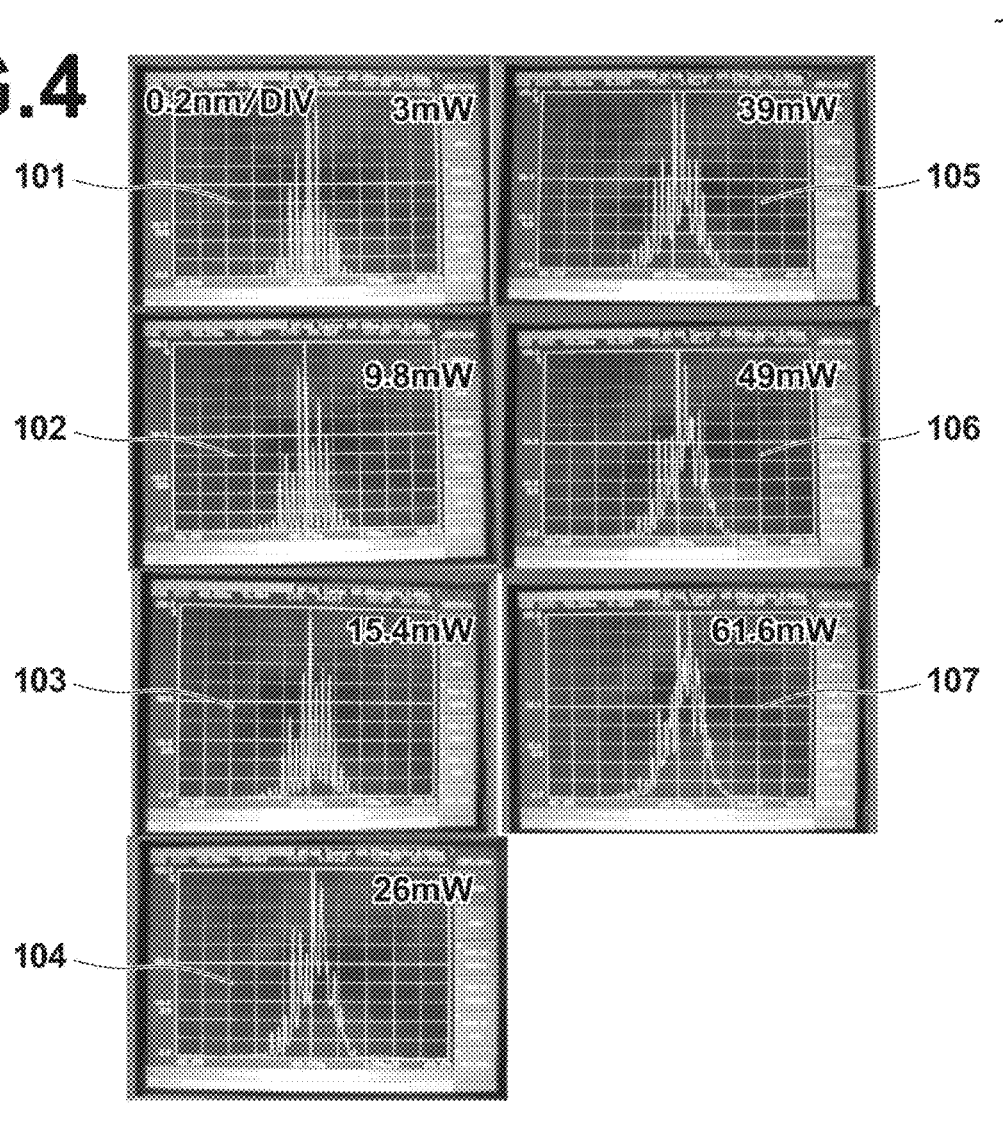
FIG. 4 shows spectra of output light when the device of FIG. 1 was driven with different drive currents.

First, longitudinal mode of the semiconductor laser device with external resonator 1 of Example 1 is described. FIG. 4 shows spectra of the output light 16 when the semiconductor light-emitting element 11 of the semiconductor laser device with external resonator 1 was driven with seven different values (average values) of the drive current. FIG. 4 shows photographs of the display screen of the optical spectrum analyzer. It should be noted that, to measure the spectra, the transmission characteristics of the narrow band pass filter 14 were set such that the transmission center wavelength $\lambda cf$ was around 482 nm by rotating the filter 14, as described previously.

The screens 101, 102, 103, 104, 105, 106, and 107 shown in FIG. 4 show the spectra when the drive current of the semiconductor light-emitting element 11 was changed such that the optical output of the semiconductor light-emitting element 11 was 3 mW, 9.8 mW, 15.4 mW, 26 mW, 39 mW, 49 mW, and 61.6 mW, respectively. On each screen, the horizontal axis indicates the wavelength and the vertical axis indicates the optical output. It can be seen from FIG. 4 that the longitudinal mode of the semiconductor laser device with external resonator 1 of Example 1 was multi-mode. Further, it was confirmed using a mode field meter provided with a CCD image sensor, for example, that the transverse mode of the semiconductor laser device with external resonator 1 of Example 1 was single mode.

Figure 5:
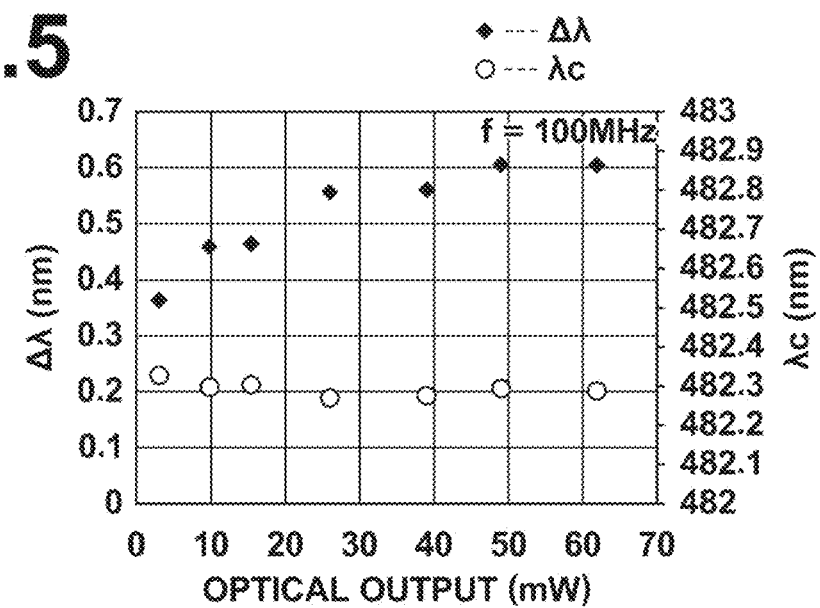
FIG. 5 is a graph showing the relationship among optical output, center wavelength, and wavelength width of output light when the device of FIG. 1 was driven with different drive currents.

FIG. 5 is a graph showing the center wavelength λc, and the wavelength width Δλ of each optical spectrum with the center wavelength λc of the output light 16 in the above-described seven cases. The center wavelength λc shown is defined such that X=10 according to the so-called Pk-XdB method. Namely, the wavelength width Δλ is a width between points a and b of the optical spectrum that is truncated by a baseline that is attenuated by 10 dB from the maximum peak value of the optical spectrum, and the center wavelength λc is the wavelength at the middle point between the points a and b. It should be noted that the wavelength width Δλ is the full width of the wavelength, which is commonly referred to as FWTM (full width at tenth maximum).

As shown in FIG. 5, it can be seen that the center wavelength λc of the output light 16 in Example 1 was stable at around 482.3 nm regardless of increase or decrease within the above range of the drive current of the semiconductor light-emitting element 11. Specifically, variation of the center wavelength λc was within the range of ±0.1 nm. Further, the wavelength width Δλ (FWTM) was within the range from 0.35 nm to 0.6 nm.

In contrast, with the semiconductor laser device with external resonator of Comparative Example 1 (having the same features as the semiconductor laser device with external resonator 1 of Example 1 except that the semiconductor light-emitting element was driven with a direct current without a high-frequency wave superimposed thereon and no wavelength control element and no external resonator were provided), the maximum variation of the center wavelength of the laser light was 1.5 nm when the drive current was increased or decreased in the same manner as in Example 1. The wavelength width Δλ (FWTM) in this case was in the range from 0.98 nm to 1.6 nm.

With the semiconductor laser device with external resonator of Comparative Example 2 (having the same features as the semiconductor laser device with external resonator 1 of Example 1 except that no wavelength control element and no external resonator were provided), the maximum variation of the center wavelength λc of the laser light was 1.2 nm when the drive current was increased or decreased in the same manner as in Example 1. The wavelength width Δλ (FWTM) in this case was in the range from 2.4 nm to 3.13 nm.

With the semiconductor laser device with external resonator of Comparative Example 3 (having the same features as the semiconductor laser device with external resonator 1 of Example 1 except that the anamorphic prism pair was applied as the wavelength control element), the drive current of the semiconductor light-emitting element was changed such that 17 different optical outputs in the range from 5.8 mW to 89 mW were obtained, and the center wavelength λc and the wavelength width Δλ (FWTM) of the laser light were measured for each case. It should be noted that this wavelength width Δλ (FWTM) is also a 1/10 width of the optical spectrum with the center wavelength λc. The results of measurement are shown in FIG. 6.

Figure 6:
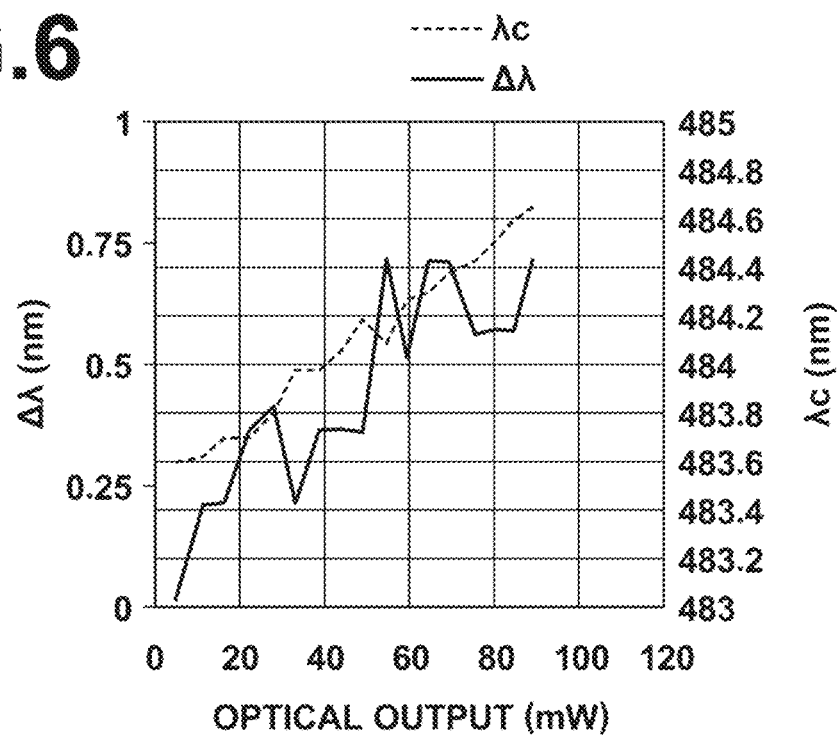
FIG. 6 is a graph showing the relationship among optical output, center wavelength, and wavelength width of output light when a semiconductor laser device with external resonator which is not according to the disclosure was driven with different drive currents.

As shown in FIG. 6, variation of the center wavelength λc of the laser light of the semiconductor laser device with external resonator of Comparative Example 3 was 1.0 nm or more along with increase and decrease of the drive current. The wavelength width Δλ (FWTM) in this case was in the range from 0.01 nm to 0.7 nm. It should be noted that the value of 0.01 nm was the limit of measurement of the wavelength meter.

As described above, it can be seen that the semiconductor laser device with external resonator 1 of Example 1 achieved a smaller variation of the center wavelength λc, a smaller wavelength width Δλ (FWTM), and a smaller variation of the wavelength width Δλ of the laser light along with increase and decrease of the drive current than the semiconductor laser devices with external resonator of Comparative Examples 1 to 3.

Figure 7:
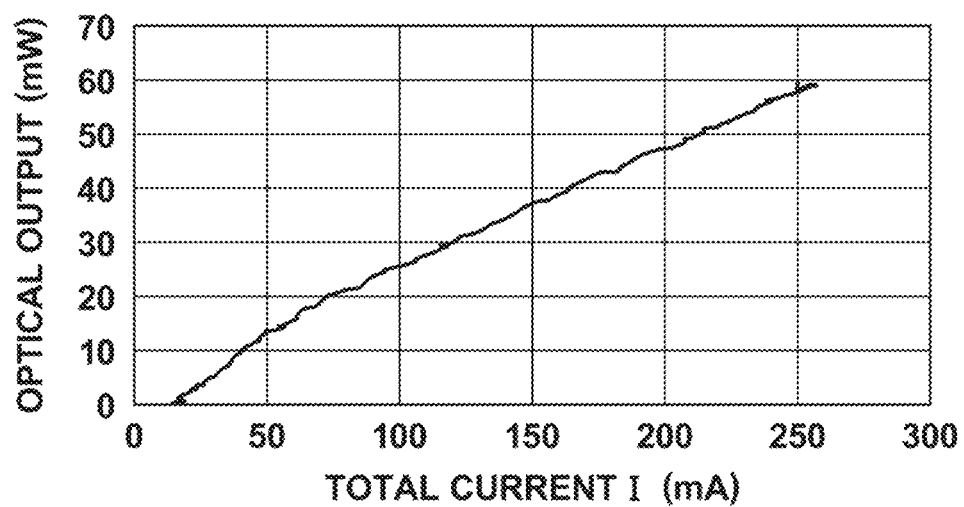
FIG. 7 is a graph showing the relationship between drive current and optical output of the device of FIG. 1.

Next, optical output characteristics of the semiconductor laser device with external resonator 1 of Example 1 are described. FIG. 7 shows results of measurement of the optical output characteristics. In FIG. 7, the total current I along the horizontal axis indicates a total current value of the direct current and the high-frequency wave current (calculated using an average current thereof). It can be seen from FIG. 7 that the optical output smoothly changed along with increase or decrease of the total current I.

Figure 8:
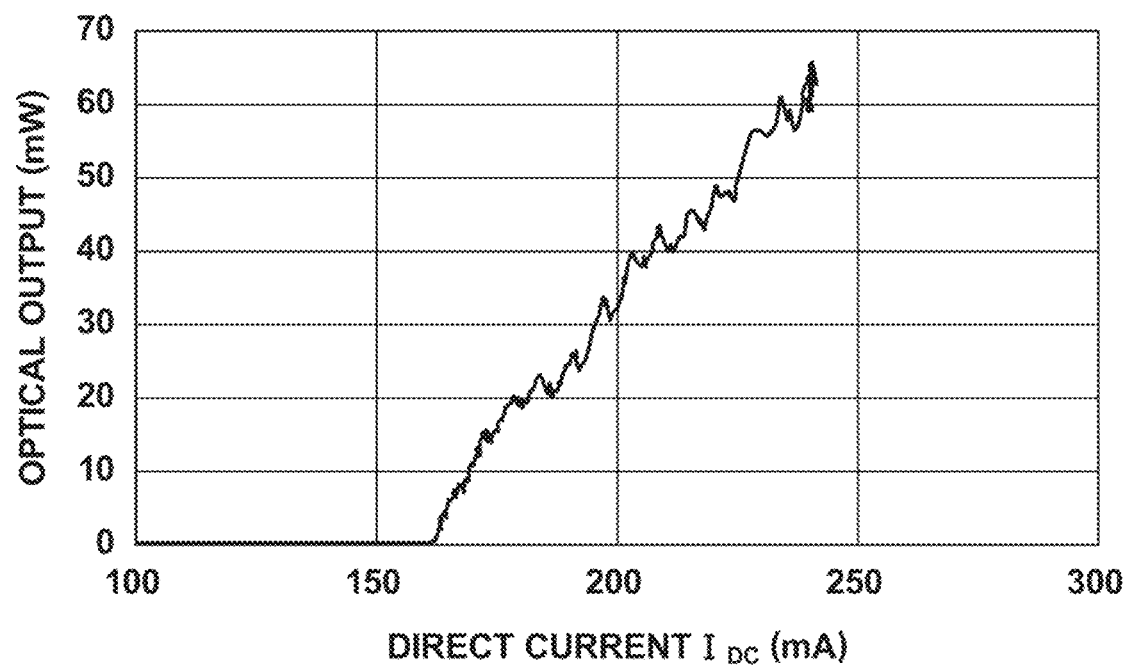
FIG. 8 is a graph showing the relationship between drive current and optical output of the semiconductor laser device with external resonator which is not according to the disclosure.

In contrast, FIG. 8 shows results of measurement of the optical output characteristics of the semiconductor laser device with external resonator of Comparative Example 4, which had the same features as those of the semiconductor laser device with external resonator 1 of Example 1 except that it was driven with a direct current without a high-frequency wave superimposed thereon. In FIG. 8, the current $I_{DC}$ along the horizontal axis indicates a value of the direct current applied to the semiconductor light-emitting element 11. It can be seen from FIG. 8 that the optical output of the semiconductor laser device of Comparative Example 4 did not smoothly changed along with increase or decrease of the direct current $I_{DC}$.

If a semiconductor laser device with external resonator, such as the devices of Comparative Examples 1 to 3, having large variation of the center wavelength λc of the laser light along with increase or decrease of the drive current is applied as a light source of devices for measuring or testing wavelength-dependent objects, results of measurement or testing vary due to the variation of the center wavelength λc. Such a semiconductor laser device with external resonator is therefore not suitable to be applied to devices for measuring or testing wavelength-dependent objects, in view of ensuring high accuracy of the measurement or testing. In contrast, the semiconductor laser device with external resonator 1 of Example 1 achieves small variation of the center wavelength λc of the laser light along with increase or decrease of the drive current, and thus is suitable for use with devices for measuring or testing wavelength-dependent objects.

Figure 9:
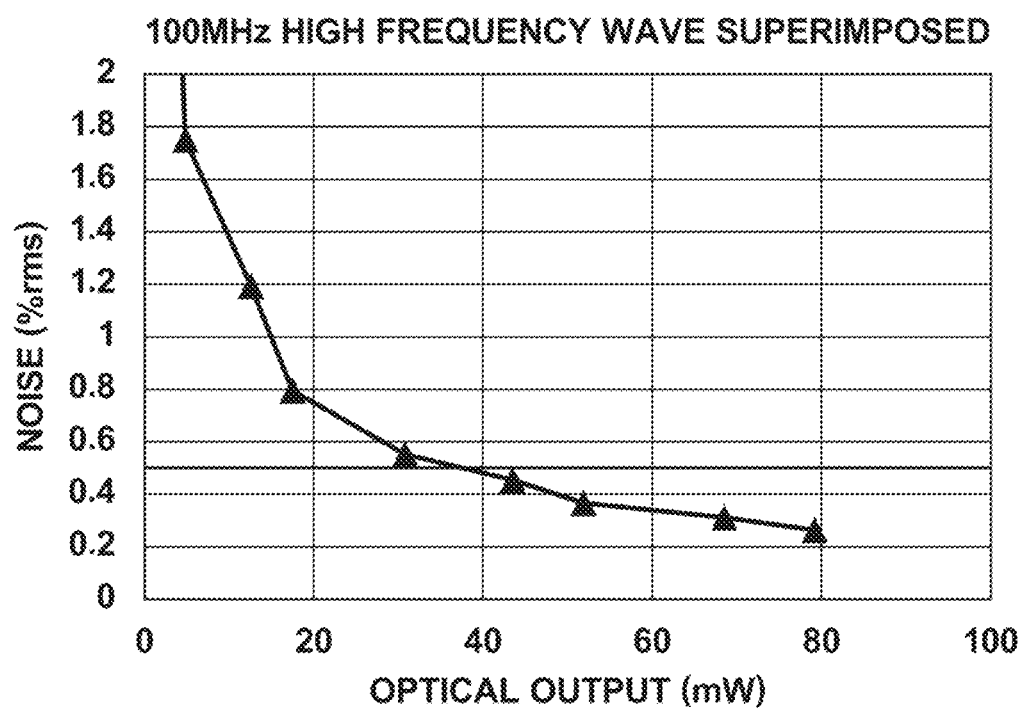
FIG. 9 is a graph showing the relationship between optical output and amount of noise of the device of FIG. 1.

Next, amount of noise of the semiconductor laser device with external resonator 1 of this embodiment is described. FIG. 9 shows noise characteristics of the output light 16 emitted from the semiconductor laser device with external resonator 1 of Example 1. In FIG. 9, the horizontal axis indicates the optical output of the output light 16, and the vertical axis indicates the ratio of noise to the optical output (% rms:percent root-mean-square). It should be noted that the measurement of this characteristics was achieved by detecting the output light 16 using a photodetector having a low-pass filter characteristics with a cut-off frequency of 20 MHz. It can be seen from FIG. 9 that, with the semiconductor laser device with external resonator 1 of Example 1, continuously decreasing or increasing noise was observed along with increase or decrease of the optical output. The reason of this is believed that the superimposition of the high-frequency wave with a frequency of 100 MHz allows the semiconductor laser device with external resonator 1 of Example 1 to oscillate light with a stable optical spectrum of light regardless of increase or decrease of the optical output.

Figure 10:
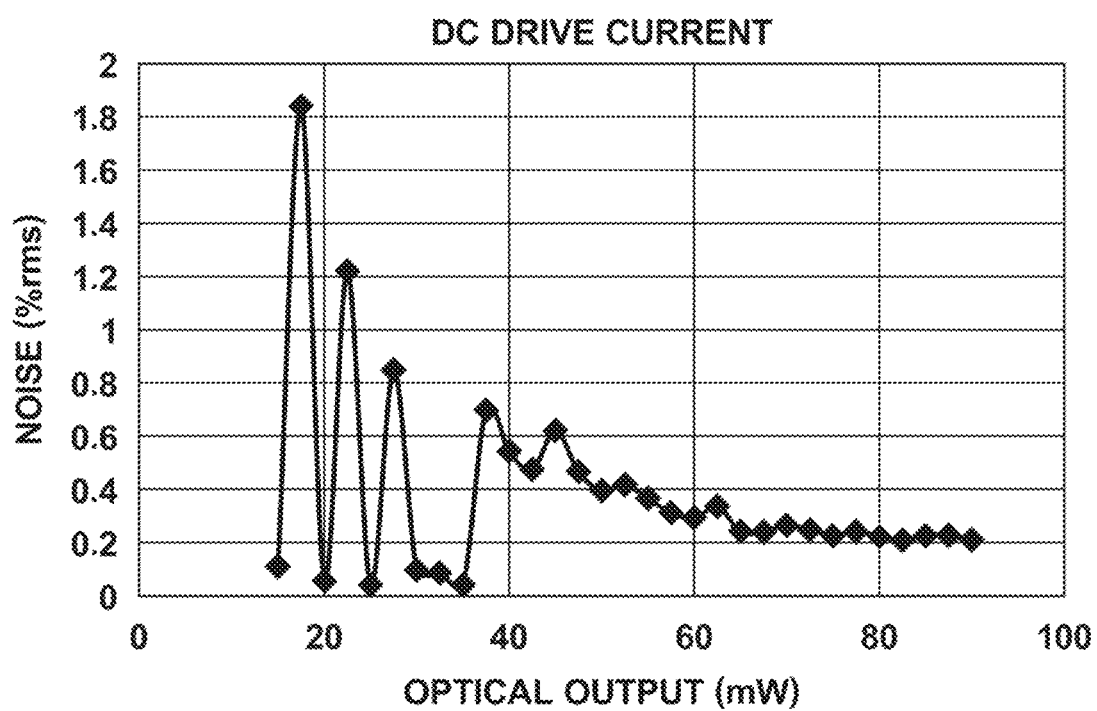
FIG. 10 is a graph showing the relationship between optical output and amount of noise of the semiconductor laser device with external resonator which is not according to the disclosure.

In contrast, FIG. 10 shows results of the same measurement performed on the semiconductor laser device with external resonator of Comparative Example 1. It can be seen from FIG. 10 that, with the semiconductor laser device with external resonator of Comparative Example 1, largely fluctuating amount of noise was observed along with increase or decrease of the optical output in the range where the optical output is about 40 mW or less. The reason of this is believed that, without the superimposition of the high-frequency wave, the optical spectrum is unstable and the number of the longitudinal modes largely fluctuates, resulting in the large fluctuation of noise.

In the above-described first embodiment, a laser diode formed by a GaN-based compound semiconductor and emitting the light 10 having a wavelength (gain peak wavelength) around 488 nm is applied. Unlike a GaAs laser diode emitting red light, and the like, for example, this laser diode has a wide lasing optical spectrum width when driven with a direct current, and provides multi-longitudinal mode lasing. These points are more notable when a high-frequency wave is superimposed on the drive current to reduce noise due to returning light. For this reason, in the case where a laser diode formed by a GaN-based compound semiconductor is used, it is very difficult to form a light source with a stable lasing wavelength and a narrow lasing wavelength width. This tendency is also found with a laser diode formed by a GaN-based compound semiconductor and emitting light having a wavelength other than 488 nm.

Stability of the lasing wavelength was examined for five samples of semiconductor laser devices with external resonator having the same features as those of the first embodiment except that laser diodes formed by GaN-based compound semiconductors and emitting light having a wavelength other than 488 nm, namely, 370 nm, 405 nm, 445 nm, 473 nm, and 530 nm, for example, were used, respectively, and it was found that basically the same advantageous effects as those of the first embodiment were obtained. As described above, in the case where a laser diode formed by a GaN-based compound semiconductor is used, applying the disclosure is particularly effective to stabilize the lasing wavelength regardless of the wavelength.

Further, while a laser diode which does not oscillate light by itself is applied as the semiconductor light-emitting element 11 in this embodiment, it was confirmed that basically the same effects as those of the first embodiment were obtained when a semiconductor light-emitting element that oscillates light by itself was applied. Specifically, stability of the lasing wavelength was examined for three samples of semiconductor laser device with external resonator having the same features as those of the first embodiment except that the front end face 11b of the semiconductor light-emitting element 11 shown in FIG. 1 was provided with a coating having a reflectance of 10%, 20%, or 30%, respectively, to the wavelength of the light emitted from the semiconductor light-emitting element 11, so that the element 11 was able to oscillate light by itself, and it was found that basically the same advantageous effects as those of the first embodiment were obtained. It should be noted that, in this case, a composite resonator is formed by a resonator, which is formed by the opposite end faces of the laser diode, i.e., the semiconductor light-emitting element, and the external resonator.

In the above-described embodiment, the value of the direct current outputted from the direct current source 21 is set to be a half the value of the amplitude of the high-frequency wave current. Thus, the drive current with the high-frequency wave superimposed thereon of the semiconductor light-emitting element 11 periodically increases and decreases with the lowest value (bottom value) being 0 (zero). However, this is not intended to limit the disclosure, and the value of the direct current outputted from the direct current source 21 may be set to be a value greater than a half the value of the amplitude of the high-frequency wave current such that the lowest value of the drive current after the high-frequency wave superimposed thereon becomes a positive (plus) value.

It should be noted that, if the value of the direct current outputted from the direct current source 21 is set to be a value smaller than a half the value of the amplitude of the high-frequency wave current, the drive current after the high-frequency wave superimposed thereon alternately takes a positive (plus) value and a negative (minus) value. In the case where a laser diode is applied as the semiconductor light-emitting element 11, as in this embodiment, it is necessary that the current flowing to the laser diode is always positive or always negative, and therefore such a situation where the drive current after the high-frequency wave superimposed thereon alternately takes a positive value and a negative value must be avoided. This point is particularly important in the case where the value of the direct current before the high-frequency wave superimposed thereon is varied in a continuous manner, as in a fourth or fifth embodiment, which will be described later.

It should be noted that connecting a zener diode in the opposite direction from the direction of the laser diode used as the semiconductor light-emitting element 11 provides higher safety, such as when a surge current is induced. It should be noted that the description "connecting . . . in the opposite direction" means that the zener diode is connected in parallel with the laser diode such that the direction of the p-n junction of the zener diode is opposite from the direction of the p-n junction of the laser diode.

Second Embodiment

Figure 11:
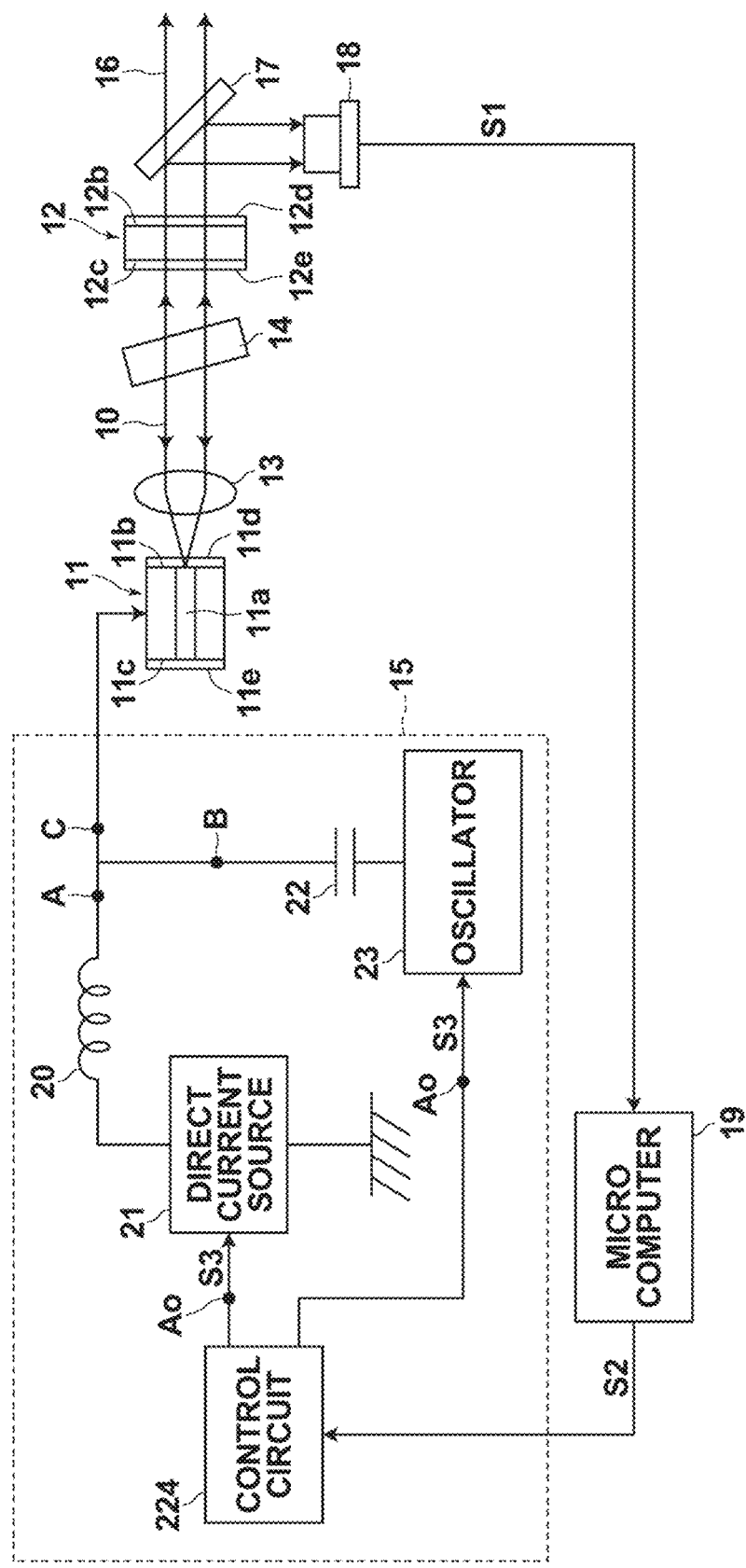
FIG. 11 is a diagram illustrating the schematic configuration of a semiconductor laser device with external resonator according to a second embodiment of the disclosure.

Next, a second embodiment of the disclosure is described. FIG. 11 is a diagram illustrating the schematic configuration of a semiconductor laser device with external resonator 2 according to the second embodiment of the disclosure. It should be noted that elements shown in FIG. 11 that are the same as those shown in FIG. 1 are designated by the same reference numerals, and they are not explained again unless otherwise necessary (the same applies to the following embodiments).

Figure 12:
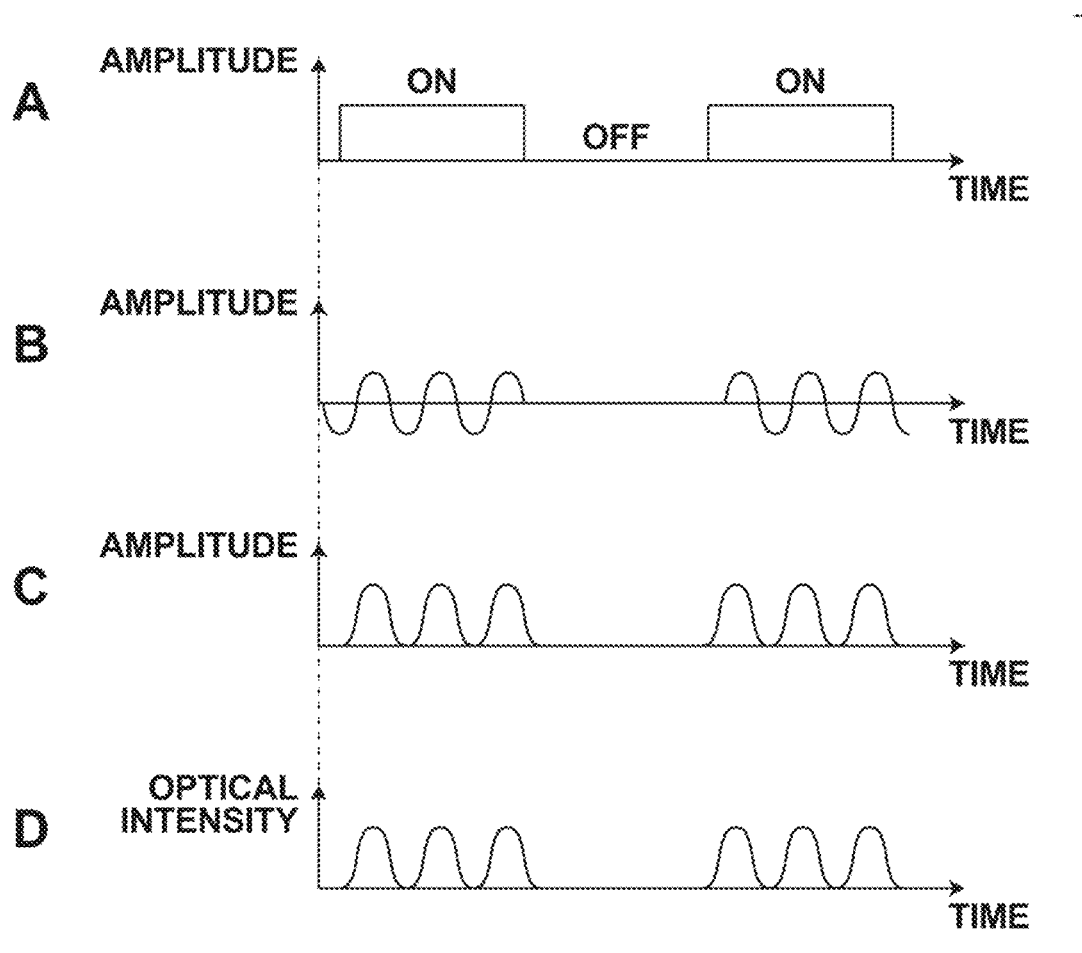
FIG. 12 shows waveform charts (A to C) of current at each point and a waveform chart (D) of output light of the device of FIG. 11.

The difference between the semiconductor laser device with external resonator 2 of this embodiment and the semiconductor laser device with external resonator 1 of the first embodiment shown in FIG. 1 lies basically in that a control circuit 224 that is different from the control circuit 24 is used in the second embodiment. Namely, the control circuit 224 outputs an external control signal S3, which is a digital signal with repeating on-periods (ON), where the signal level rises to a predetermined level, and off-periods (OFF), where the signal level is 0 (zero) level. The schematic waveform of the external control signal S3 flowing through the point Ao shown in FIG. 11 is shown at A in FIG. 12.

The external control signal S3 is inputted to the direct current source 21 and the oscillator 23. When the external control signal S3 is inputted, the direct current source 21 outputs a current having the same waveform as that of the external control signal S3. Namely, the waveform of the current flowing through the point A shown in FIG. 11 is basically the waveform shown at A in FIG. 12.

On the other hand, the oscillator 23 outputs, when the external control signal S3 is inputted, a high-frequency wave current having a sinusoidal waveform. The level of the high-frequency wave current corresponds to the output level of the external control signal S3. Namely, the waveform of the signal flowing through the point B shown in FIG. 11 is the waveform shown at B in FIG. 12.

The current that has flown through the coil 20, i.e., the current flowing through the point A shown in FIG. 11, is then added as a bias current to the high-frequency wave current that has passed through the capacitor 22. Thus, negative current components of the current flowing through the point C shown in FIG. 11 have been eliminated and a positive current waveform is obtained. The schematic waveform of the drive current flowing through the point C shown in FIG. 11 is shown at C in FIG. 12. Accordingly, a drive current that periodically turns on and off is applied to the semiconductor light-emitting element 11.

The semiconductor light-emitting element 11 receives the drive current and emits the light 10. Then, laser light is obtained in the same manner as with the semiconductor laser device with external resonator 1 of FIG. 1. A part of the laser light is transmitted through the resonator mirror 12 and is extracted from the resonator as the output light 16. The schematic waveform of the output light 16 is shown at D in FIG. 12. As shown, the output light 16 is outputted intermittently as pulses correspondingly to the ON-OFF waveform of the drive current of the semiconductor light-emitting element 11. In each light emission period of the output light 16, the optical output of the output light 16 periodically increases and decreases correspondingly to the waveform of the high-frequency wave current.

As described above, in this embodiment, digital modulation of the optical output of the output light 16 can be achieved based on the external control signal S3. Such digital modulation is applicable to pulse width modulation or pulse number modulation for image recording or image display, for example. Also in this embodiment, the output light 16, which is pulsed light, is subjected to the fast modulation through the drive current with the high-frequency wave superimposed thereon, and the advantageous effects of the fast modulation can be obtained as with the first embodiment.

Now, the relationship between the frequency of the high-frequency wave current superimposed on the drive current of the semiconductor light-emitting element 11 and the frequency of the external control signal S3 is described. It is assumed in this description that the ON-periods and OFF-periods of the external control signal S3 are equal to each other and the external control signal S3 turns on and off at a constant frequency. It is desirable that the frequency of the high-frequency wave current be twice or more the frequency of the external control signal S3. If it is not, one cycle of the high-frequency wave signal cannot be present within one ON-period of the external control signal S3, which, in turn, makes it impossible to achieve at least one cycle of increase and decrease of the optical output within one period of light emission of the output light 16.

In particular, in a case where the pulsed output light 16 that is emitted intermittently is used for image recording, where one dot (pixel) is recorded with the output light 16 including a plurality of pulses, it is desirable that the frequency of the high-frequency wave current be even higher than twice the frequency of the external control signal S3.

Third Embodiment

Figure 13:
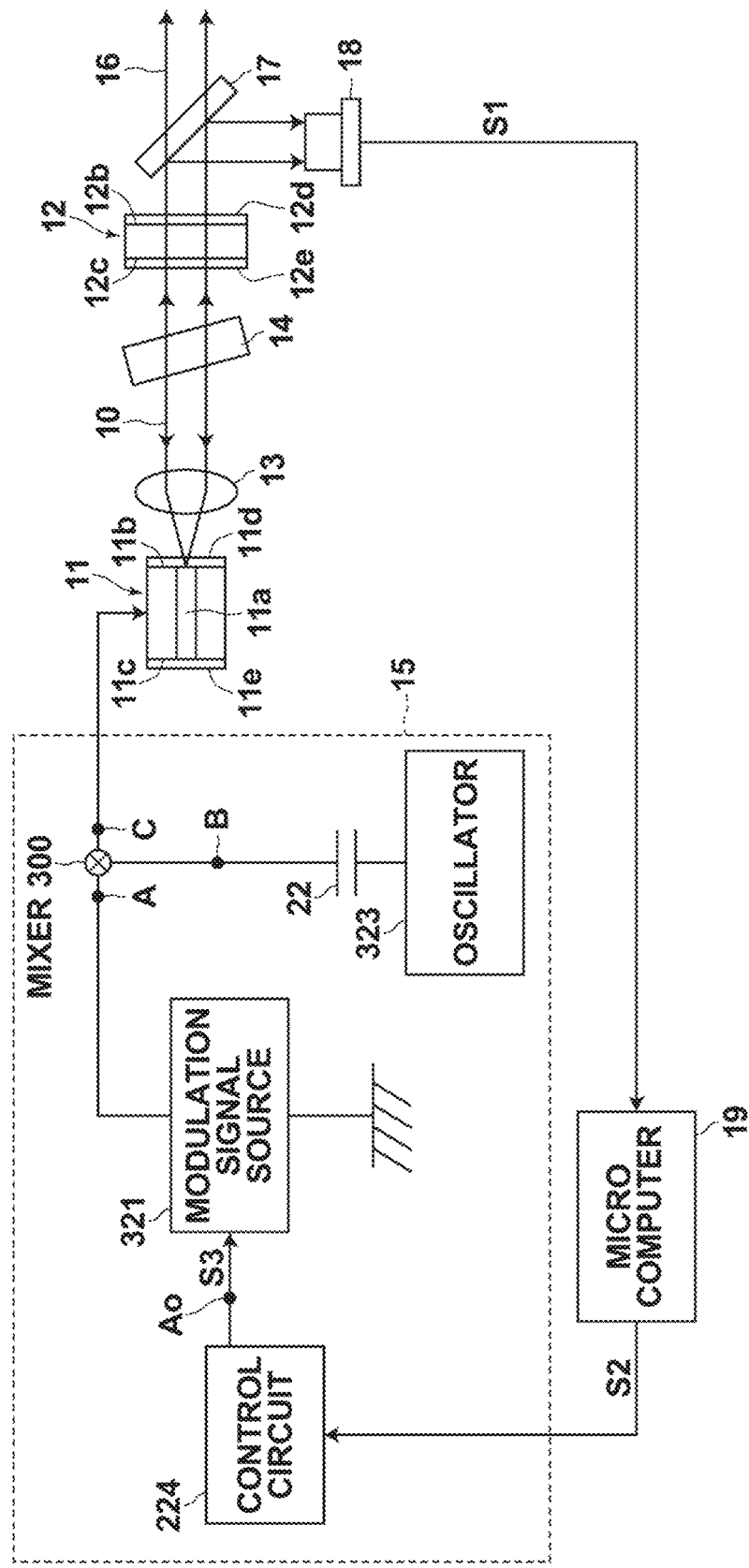
FIG. 13 is a diagram illustrating the schematic configuration of a semiconductor laser device with external resonator according to a third embodiment of the disclosure.

Next, a third embodiment of the disclosure is described. FIG. 13 is a diagram illustrating the schematic configuration of a semiconductor laser device with external resonator 3 according to the third embodiment of the disclosure. The difference between the semiconductor laser device with external resonator 3 of this embodiment and the semiconductor laser device with external resonator 2 of the second embodiment shown in FIG. 11 basically lies in that, in the third embodiment, an oscillator 323 that is different from the oscillator 23 is used, a modulation signal source 321 is used in place of the direct current source 21, and a mixer 300 is disposed between the capacitor 22 and the semiconductor light-emitting element 11. It should be noted that, in this configuration, the coil 20 shown in FIG. 11 is not necessary.

Figure 14:
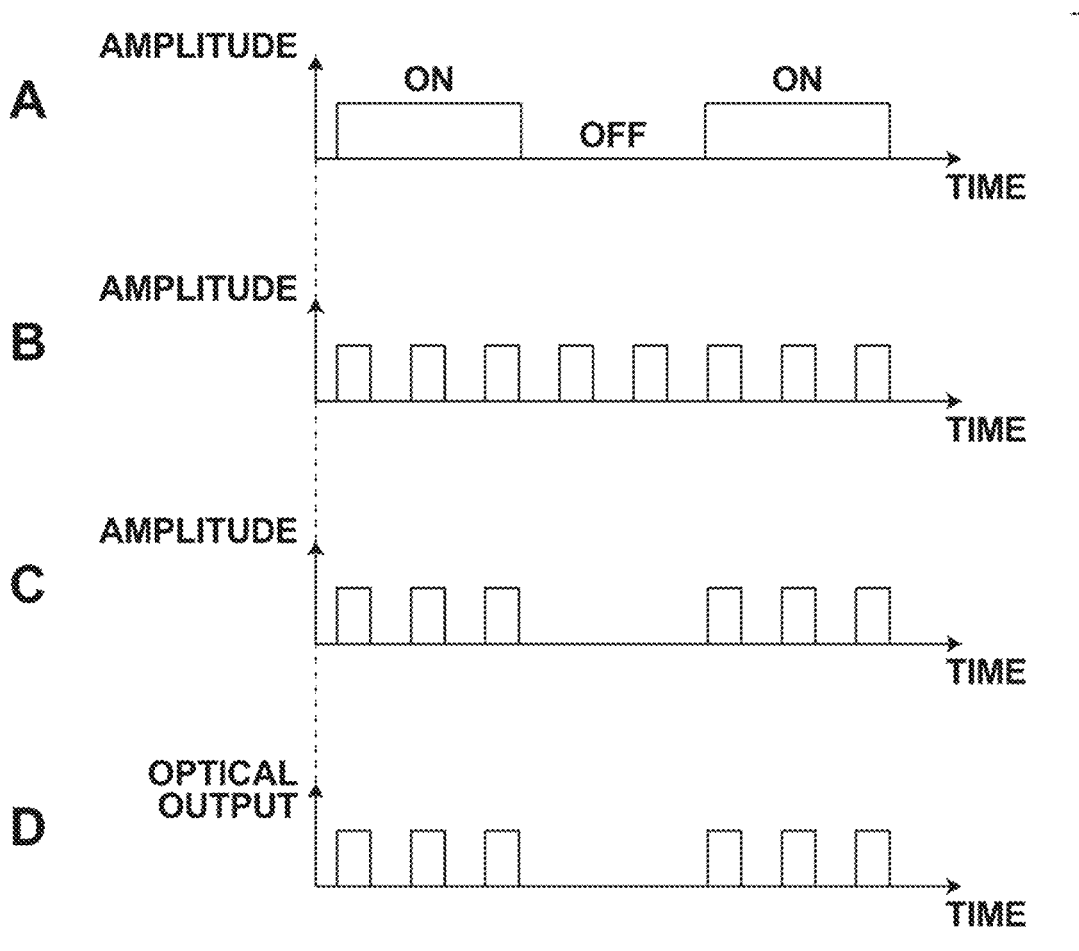
FIG. 14 shows waveform charts (A to C) of current at each point and a waveform chart (D) of output light of the device of FIG. 13.

The modulation signal source 321 receives the external control signal S3 and outputs a modulation signal, which is a voltage signal, and the modulation signal is inputted to the mixer 300. The waveform of the modulation signal is shown at A in FIG. 14. It should be noted that, in this embodiment, a control circuit 224 that is similar to the control circuit of the semiconductor laser device with external resonator 2 of the second embodiment shown in FIG. 11 is used. The schematic waveform of the external control signal S3 outputted from the control circuit 224 and flowing through the point Ao shown in FIG. 13 is shown at A in FIG. 14. That is, the waveform of the modulation signal flowing through the point A shown in FIG. 13 is basically the same as the waveform of the external control signal S3.

On the other hand, the oscillator 323 outputs a pulsed current with repeating on-periods (ON), where the signal level rises to a predetermined level, and off-periods (OFF), where the signal level is 0 (zero) level. The schematic waveform of the pulsed current flowing through the point B shown in FIG. 13 is shown at B in FIG. 14.

The pulsed current passed through the capacitor 22 is subjected to modulation at the mixer 300 based on the modulation signal outputted from the modulation signal source 321. Thus, a drive current formed by the pulsed current is applied to the semiconductor light-emitting element 11 only periods where the level of the external control signal S3 is risen. The schematic waveform of the drive current flowing through the point C shown in FIG. 13 is shown at C in FIG. 14.

The semiconductor light-emitting element 11 receives the drive current and emits the light 10. Then, laser light is obtained in the same manner as with the semiconductor laser device with external resonator 1 of FIG. 1. A part of the laser light is transmitted through the resonator mirror 12 and is extracted from the resonator as the output light 16. The schematic waveform of the output light 16 is shown at D in FIG. 14. As shown, pulses of the output light 16 are outputted correspondingly to the pulse waveform of the drive current of the semiconductor light-emitting element 11.

As described above, in this embodiment, digital modulation of the optical output of the output light 16 can be achieved based on the external control signal S3. Such digital modulation is applicable to pulse width modulation or pulse number modulation for image recording or image display, for example. Also in this embodiment, the output light 16 is subjected to the fast modulation in a pulsed manner, and the advantageous effects of the fast modulation can be obtained as with the second embodiment.

Fourth Embodiment

Figure 15:
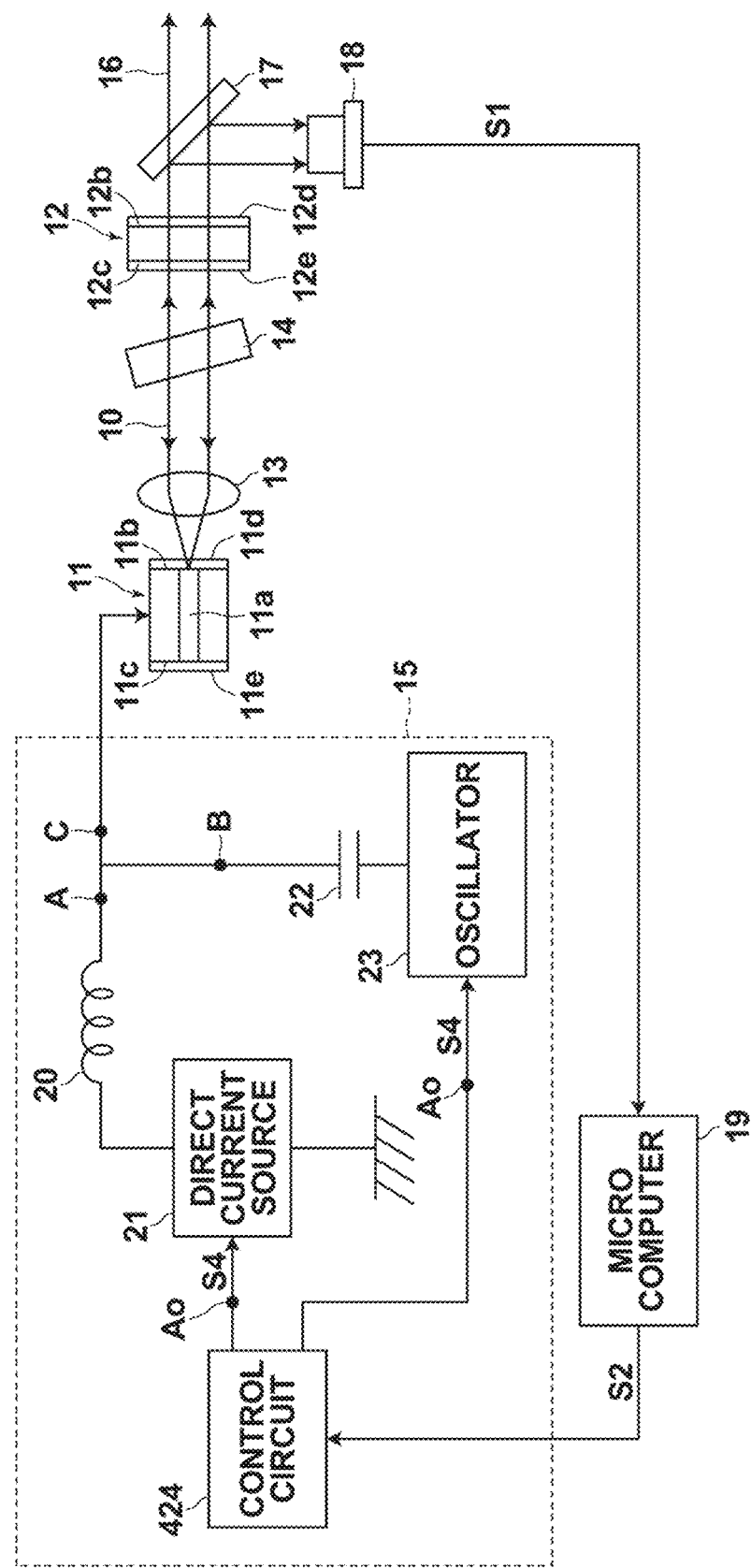
FIG. 15 is a diagram illustrating the schematic configuration of a semiconductor laser device with external resonator according to a fourth embodiment of the disclosure.
Figure 16:
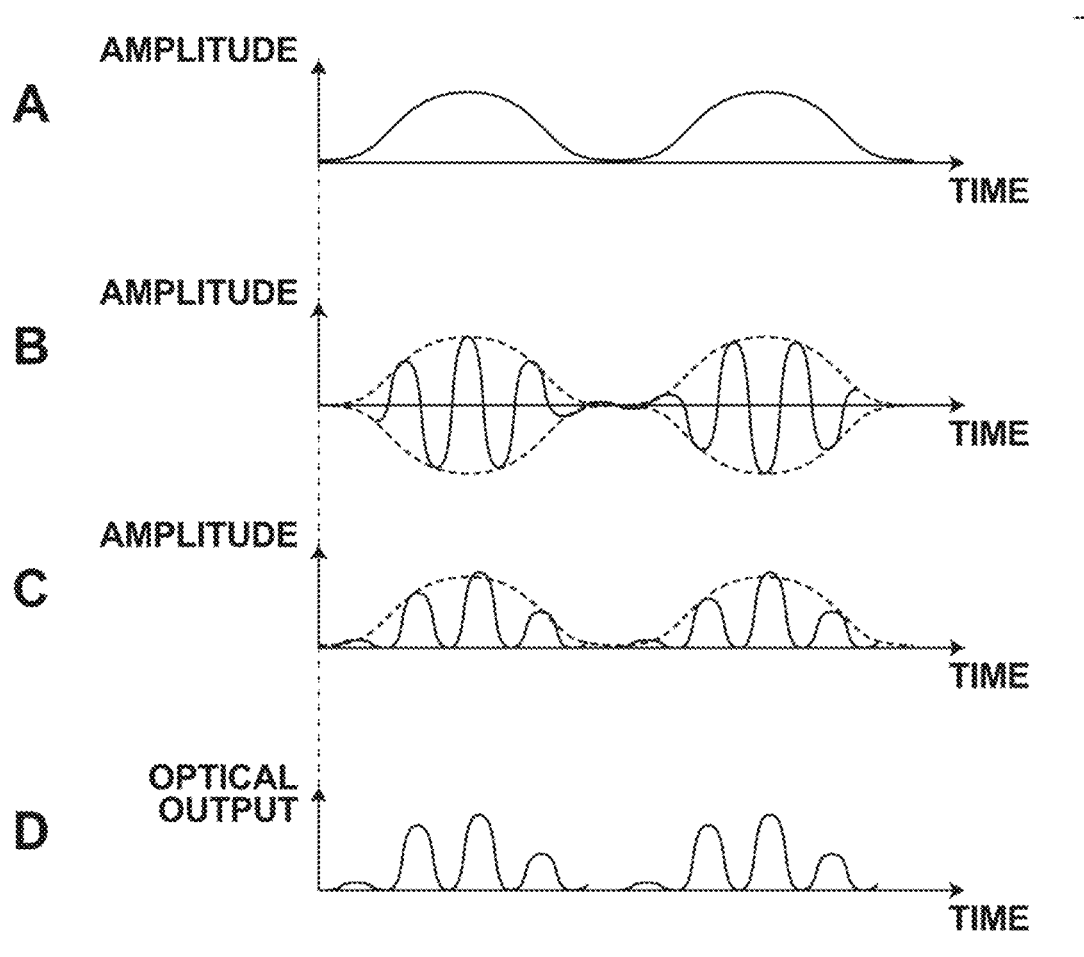
FIG. 16 shows waveform charts (A to C) of current at each point and a waveform chart (D) of output light of the device of FIG. 15.

Next, a fourth embodiment of the disclosure is described. FIG. 15 is a diagram illustrating the schematic configuration of a semiconductor laser device with external resonator 4 according to the fourth embodiment of the disclosure. The difference between the semiconductor laser device with external resonator 4 of this embodiment and the semiconductor laser device with external resonator 1 of the first embodiment shown in FIG. 1 basically lies in that a control circuit 424 that is different from the control circuit 24 is used in the fourth embodiment. Namely, the control circuit 424 outputs an external control signal S4 formed by an analog signal having a sinusoidal waveform. The schematic waveform of the external control signal S4 flowing through the point Ao shown in FIG. 15 is shown at A in FIG. 16.

The external control signal S4 is inputted to the direct current source 21 and the oscillator 23. When the external control signal S4 is inputted, the direct current source 21 outputs a direct current having basically the same waveform as that of the external control signal S4. Namely, the waveform of the direct current flowing through the point A shown in FIG. 15 is the waveform shown at A in FIG. 16.

On the other hand, the oscillator 23, when the external control signal S4 is inputted, outputs a high-frequency wave current having a sinusoidal waveform. The level of the high-frequency wave current corresponds to the output level of the external control signal S4. Namely, the waveform of the signal flowing through the point B shown in FIG. 15 is the waveform shown at B in FIG. 16.

The current signal that has flown through the coil 20, i.e., the current flowing through the point A shown in FIG. 15, is then added as a bias current to the high-frequency wave current that has passed through the capacitor 22. Thus, negative current components of the current flowing through the point C shown in FIG. 15 have been eliminated and a positive current waveform is obtained. The schematic waveform of the drive current flowing through the point C shown in FIG. 15 is shown at C in FIG. 16. Accordingly, a drive current formed by the high-frequency wave current subjected to the amplitude modulation according to the external control signal S4 is applied to the semiconductor light-emitting element 11. The schematic waveform of the drive current flowing through the point C shown in FIG. 15 is shown at C in FIG. 16.

The semiconductor light-emitting element 11 receives the drive current and emits the light 10. Then, laser light is obtained in the same manner as with the semiconductor laser device with external resonator 1 of FIG. 1. A part of the laser light is transmitted through the resonator mirror 12 and is extracted from the resonator as the output light 16. The schematic waveform of the output light 16 is shown at D in FIG. 16. As shown, the output light 16 is periodically emitted correspondingly to the waveform of the high-frequency wave current, and the optical output for each light emission varies correspondingly to the amplitude modulation waveform of the drive current of the semiconductor light-emitting element 11.

As described above, in this embodiment, analog modulation of the optical output of the output light 16 can be achieved based on the external control signal S4. Such analog modulation is applicable to optical intensity modulation for image recording or image display, for example. Also in this embodiment, the output light 16 to be subjected to the intensity modulation is subjected to the fast modulation based on the high-frequency wave current, and the advantageous effects of the fast modulation can be obtained as with the first embodiment.

It should be noted that, although the external control signal S4 has a sinusoidal waveform in this embodiment, the external control signal S4 may have a waveform other than the sinusoidal waveform.

Fifth Embodiment

Figure 17:
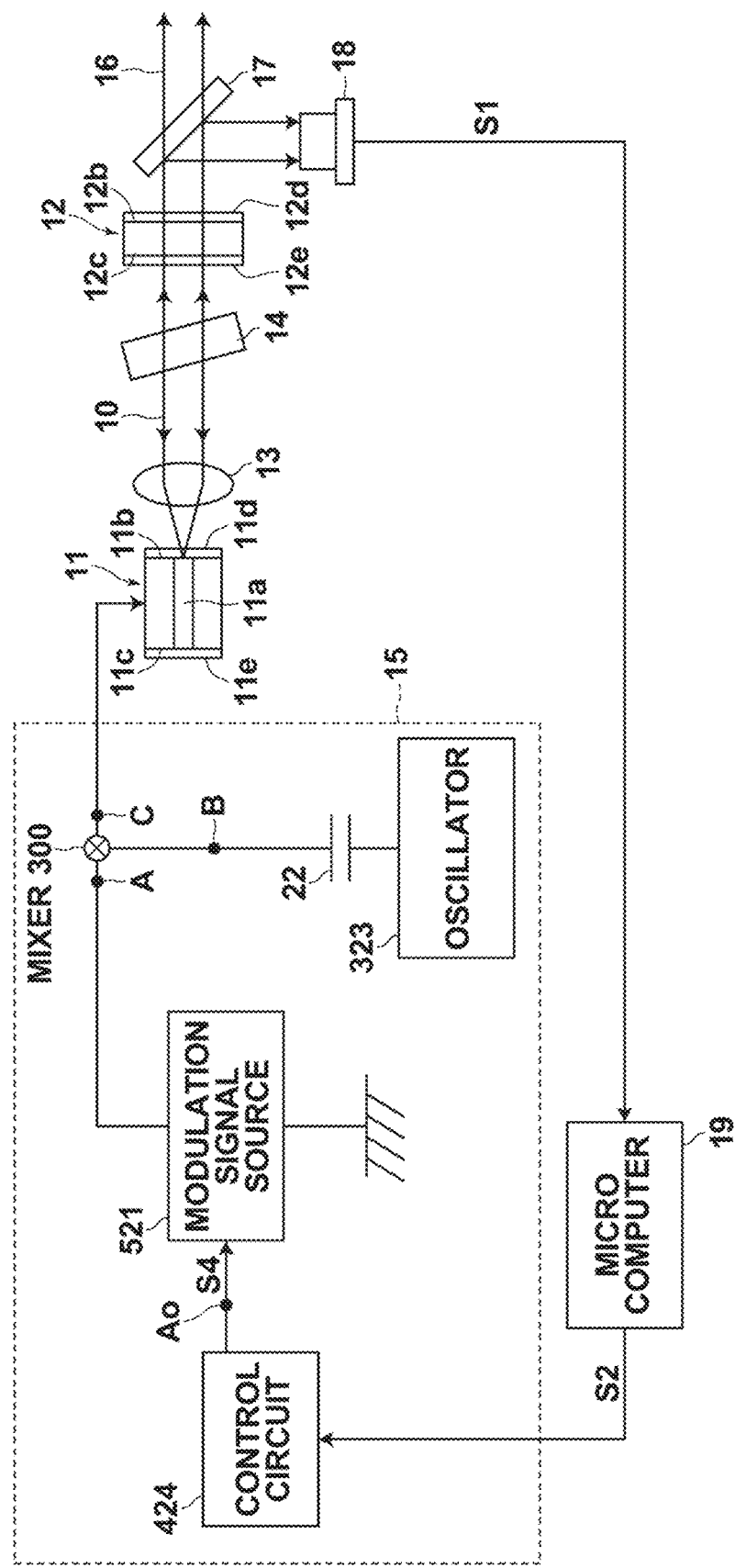
FIG. 17 is a diagram illustrating the schematic configuration of a semiconductor laser device with external resonator according to a fifth embodiment of the disclosure.

Next, a fifth embodiment of the disclosure is described. FIG. 17 is a diagram illustrating the schematic configuration of a semiconductor laser device with external resonator 5 according to the fifth embodiment of the disclosure. The difference between the semiconductor laser device with external resonator 5 of this embodiment and the semiconductor laser device with external resonator 3 of the third embodiment shown in FIG. 13 basically lies in that, in the fifth embodiment, a modulation signal source 521 that is different from the modulation signal source 321 is used, and a control circuit 424 that is different from the control circuit 224 is used. It should be noted that the control circuit 424 is basically the same as one shown in FIG. 15.

Figure 18:
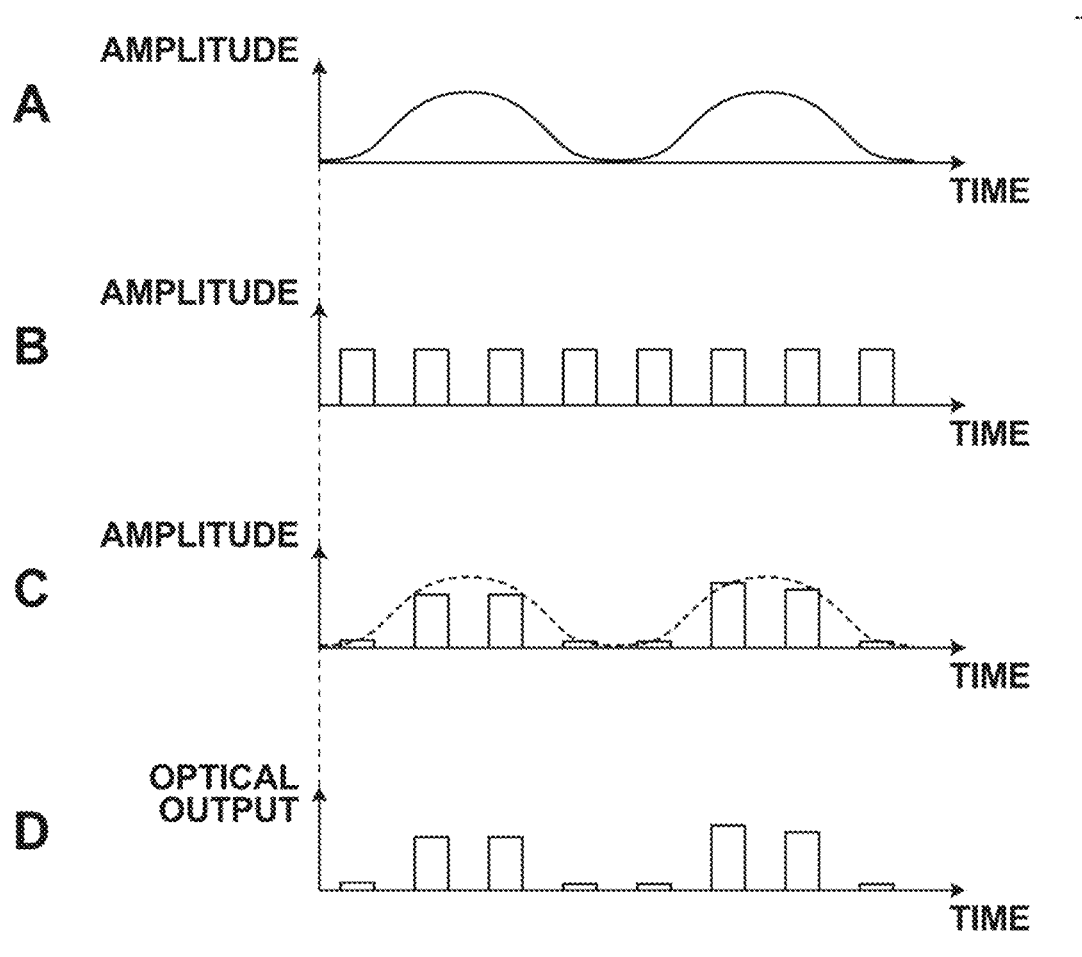
FIG. 18 shows waveform charts (A to C) of current at each point and a waveform chart (D) of output light of the device of FIG. 17.

The modulation signal source 521 receives the external control signal S4 and outputs a modulation signal, which is a voltage signal, and the modulation signal is inputted to the mixer 300. The waveform of the modulation signal is shown at A in FIG. 18.

On the other hand, the oscillator 323 is similar to one shown in FIG. 13, and outputs a pulsed current with repeating on-periods (ON), where the signal level rises to a predetermined level, and off-periods (OFF), where the signal level is 0 (zero) level. The schematic waveform of the pulsed current flowing through the point B shown in FIG. 17 is shown at B in FIG. 18. The schematic waveform of the external control signal S4 outputted from the control circuit 424 and flowing through the point Ao shown in FIG. 17 is shown at A in FIG. 18. That is, the waveform of the current flowing through the point A shown in FIG. 17 is basically the same as the waveform of the external control signal S4.

The pulsed current passed through the capacitor 22 is subjected to modulation at the mixer 300 based on the modulation signal outputted from the modulation signal source 521. Namely, this pulsed current is subjected to amplitude modulation to convert the waveform of the modulation signal into an envelope waveform. Thus, a drive current formed by the pulsed current subjected to the amplitude modulation according to the external control signal S4 is applied to the semiconductor light-emitting element 11. The schematic waveform of the drive current flowing through the point C shown in FIG. 17 is shown at C in FIG. 18.

The semiconductor light-emitting element 11 receives the drive current and emits the light 10. Then, laser light is obtained in the same manner as with the semiconductor laser device with external resonator 1 of FIG. 1. A part of the laser light is transmitted through the resonator mirror 12 and is extracted from the resonator as the output light 16. The schematic waveform of the output light 16 is shown at D in FIG. 18. As shown, the output light 16 is periodically emitted correspondingly to the waveform of the pulsed current, and the optical intensity for each light emission varies correspondingly to the amplitude modulation waveform (the envelope) of the drive current of the semiconductor light-emitting element 11.

As described above, in this embodiment, the optical intensity of the output light 16 can be modulated based on the external control signal S4. The output light 16 to be subjected to the intensity modulation is subjected to the fast modulation based on the pulsed current, and the advantageous effects of the fast modulation can be obtained as with the first embodiment.

Figure 19:
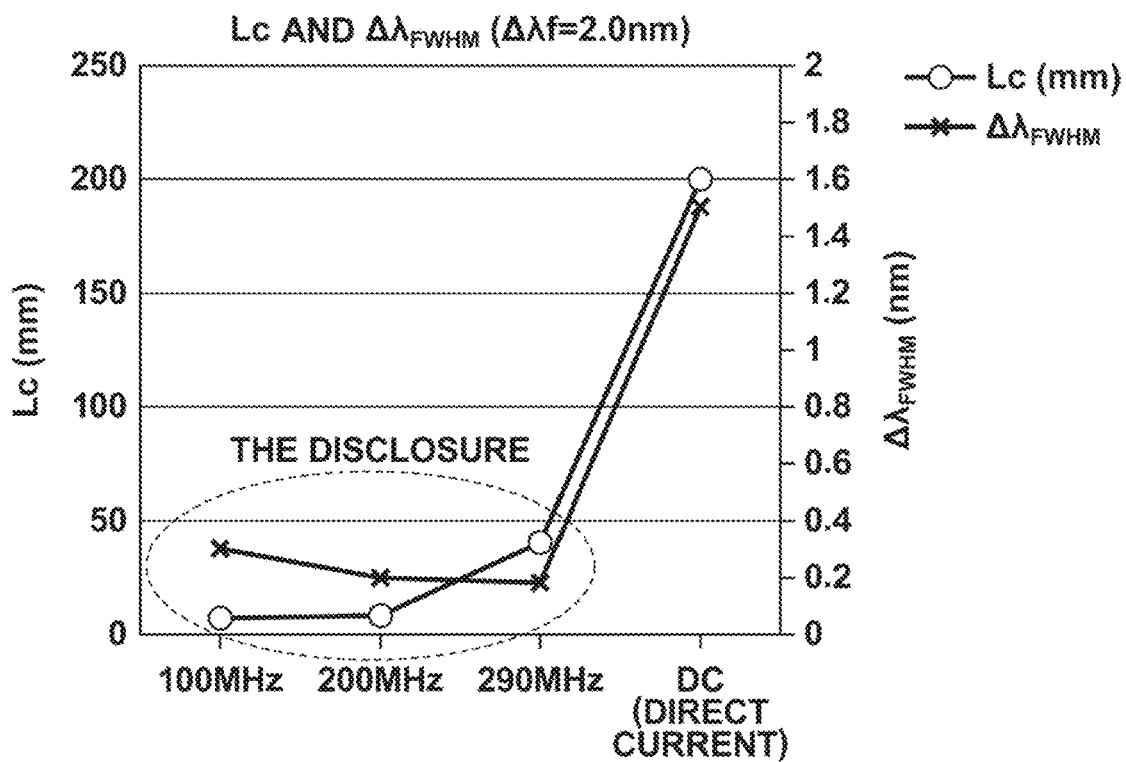
FIG. 19 is a graph showing one example of results of measurement of coherent length and lasing wavelength width of the semiconductor laser device with external resonator of the disclosure.
Figure 20:
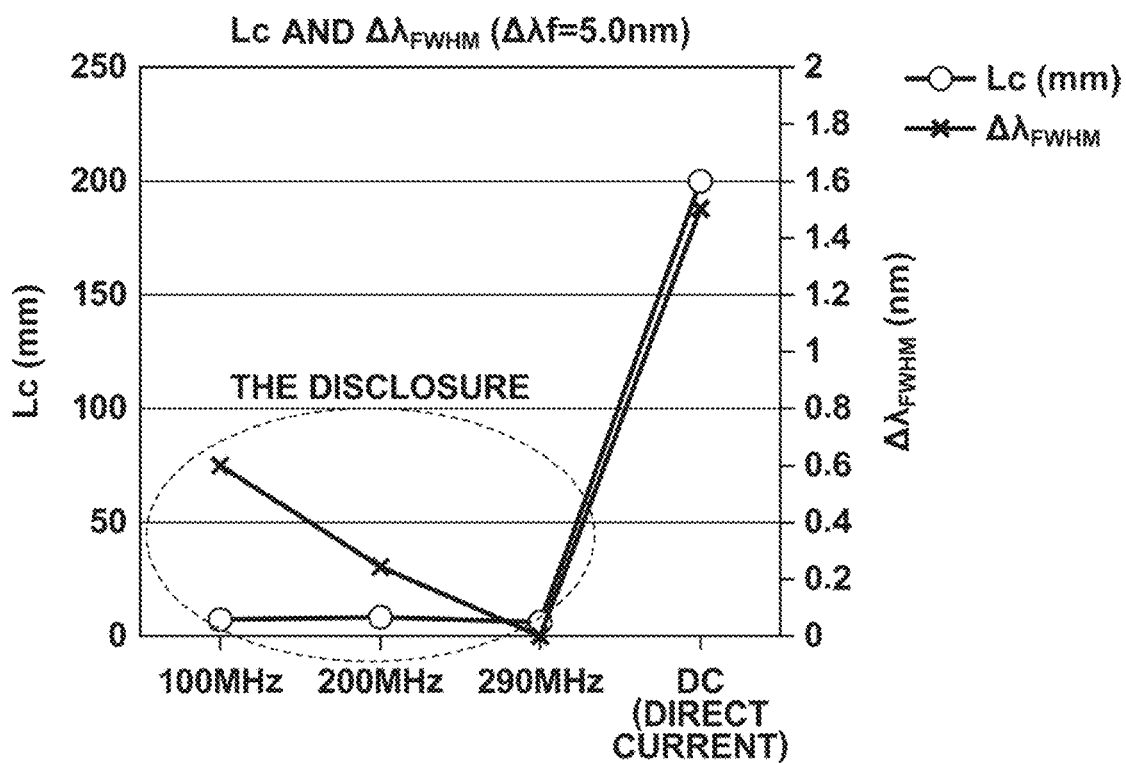
FIG. 20 is a graph showing another example of results of measurement of coherent length and lasing wavelength width of the semiconductor laser device with external resonator of the disclosure.

Next, coherent length, etc., of the semiconductor laser device with external resonator of the disclosure are described. FIGS. 19 and 20 show results of measurement of a coherent length Lc and a lasing wavelength width Δλ (FWTM) of the semiconductor laser device with external resonator according to the disclosure, in particular, the previously described semiconductor laser device with external resonator of Example 1.

It should be noted that FIG. 19 shows results of measurement in the case where a narrow band pass filter having the transmission characteristics (transmission width Δλf=2.0 nm) shown in FIG. 2 is used as the narrow band pass filter 14. On the other hand, FIG. 20 shows results of the measurement in the case where a narrow band pass filter having a different transmission width Δλf (transmission width Δλf=5.0 nm) from that of the transmission characteristics shown in FIG. 2 is used as the narrow band pass filter 14. Each of FIGS. 19 and 20 shows the results of the measurement in the cases where the modulation frequency of the fast modulation is set at 100 MHz, 200 MHz, and 290 MHz, and also shows, at the right-most position, results of the measurement of a common semiconductor laser for comparison. The common semiconductor laser, as used herein, refers to a semiconductor laser that can oscillate light by itself and does not include an external resonator, is driven with a DC, and has an lasing wavelength (the center wavelength) of 488 nm, with the longitudinal mode being multi-mode.

When compared with the semiconductor laser device with external resonator of the disclosure, the common semiconductor laser has a wider lasing wavelength width Δλ (that is, the center wavelength tends to vary), and has a longer coherent length Lc, i.e., is highly coherent. These properties makes the common semiconductor laser difficult to handle. Specifically, due to interference and speckle, the value of detection data when the laser light is received with a detector may vary, or the intensity distribution pattern of the laser light beam may fluctuate.

In contrast, the semiconductor laser device with external resonator of the disclosure has a narrow lasing wavelength width Δλ, and the lasing wavelength thereof being locked by the external resonator and the wavelength control element (the narrow band pass filter 14) provides a stable center wavelength that does not tend to vary. Further, the semiconductor laser device with external resonator of the disclosure has a short coherent length Lc of several millimeters, i.e., low coherence. These properties makes the semiconductor laser device with external resonator of the disclosure easy to handle. Specifically, the value of detection data when the laser light is received with a detector is stabilized. Further, the beam intensity distribution pattern of the laser light is smooth, thereby allowing more accurate measurement of the beam diameter, for example.

As described above, the semiconductor laser device with external resonator of the disclosure has a short coherent length Lc of several millimeters and thus has characteristics like a light-emitting diode (LED) with reduced flaw due to interference. Further, the semiconductor laser device with external resonator of the disclosure has a narrow lasing wavelength width Δλ, and thus is highly monochromatic, and this allows focusing the outputted laser light to the diffraction limit, similarly to common semiconductor lasers.

Further, while the output power from a light-emitting diode is up to around 10 mW, the semiconductor laser device with external resonator of the disclosure can provide an output power of 100 mW or more, as with common semiconductor lasers.

Although a laser diode formed by a nitride semiconductor is applied as the semiconductor light-emitting element 11 in the above-described first to fifth embodiments, this is not intended to limit the semiconductor light-emitting element usable with the semiconductor laser device with external resonator of the disclosure. Further, the laser diode formed by a nitride semiconductor applicable to the semiconductor light-emitting element 11 is not limited to one that emits light with the above-described wavelength, and a laser diode formed by a nitride semiconductor that emits the light 10 with a wavelength of around 370 nm to 530 nm may also be used, as appropriate.

Further, as the laser diode as described above, a relatively high power laser diode with multiple transverse modes may also be usable. As another example, the disclosure is also applicable to a laser diode serving as a pumping source for a laser diode-pumped solid-state laser, for example, where the laser diode formed by a nitride semiconductor that emits laser light with a wavelength of around 445 nm is used as the pumping source, and the laser light is used to pump a solid-state laser medium, such as LiYF crystal doped with $Pr^{3+}$.

Also, the wavelength control element usable with the semiconductor laser device with external resonator of the disclosure is not limited to the above-described narrow band pass filter, and any other known element, such as a VBG (Volume Bragg Grating), a prism pair, or a combination of a narrow band pass filter and a prism pair arranged in series in the optical path within the resonator can also be used, as appropriate.

Although the rear end face 12c of the resonator mirror 12 is provided with the partial reflection coating 12e, and this rear end face 12c and the rear end face 11c of the semiconductor light-emitting element 11 form the external resonator in the above-described first to fifth embodiments, the front end face 12b of the resonator mirror 12 may be provided with the partial reflection coating, and this front end face 12b and the rear end face 11c of the semiconductor light-emitting element 11 may form the external resonator. This point also applies to a sixth embodiment and the following embodiments described below.

Sixth Embodiment

Figure 21:
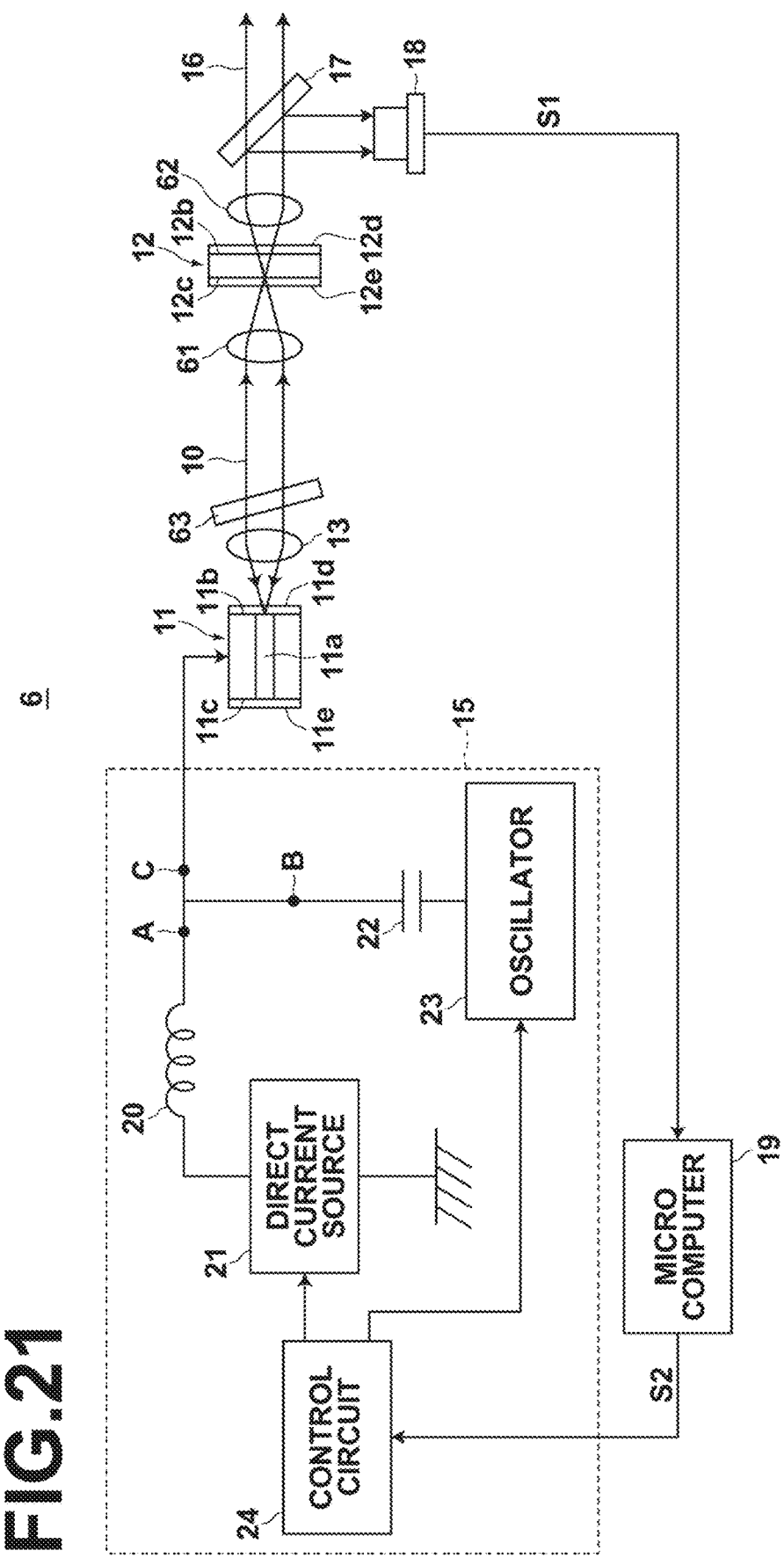
FIG. 21 is a diagram illustrating the schematic configuration of a semiconductor laser device with external resonator according to a sixth embodiment of the disclosure.
Figure 22:
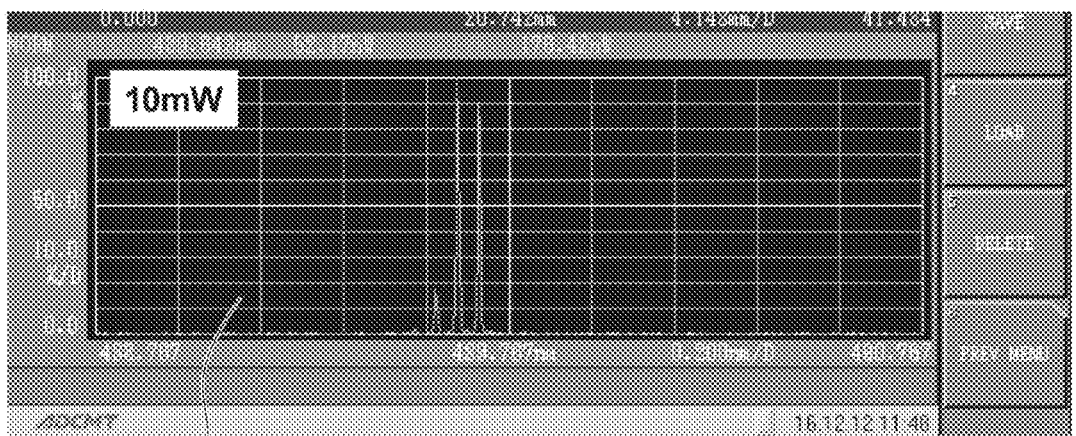
FIG. 22 shows optical spectrum of output light when the device shown in FIG. 21 was driven such that the optical output was 10 mW.
Figure 23:
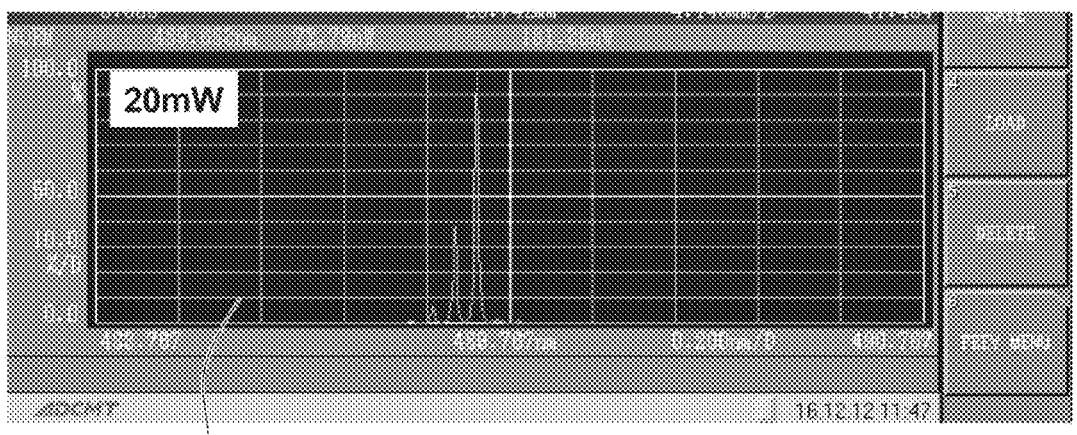
FIG. 23 shows optical spectrum of output light when the device shown in FIG. 21 was driven such that the optical output was 20 mW.
Figure 24:
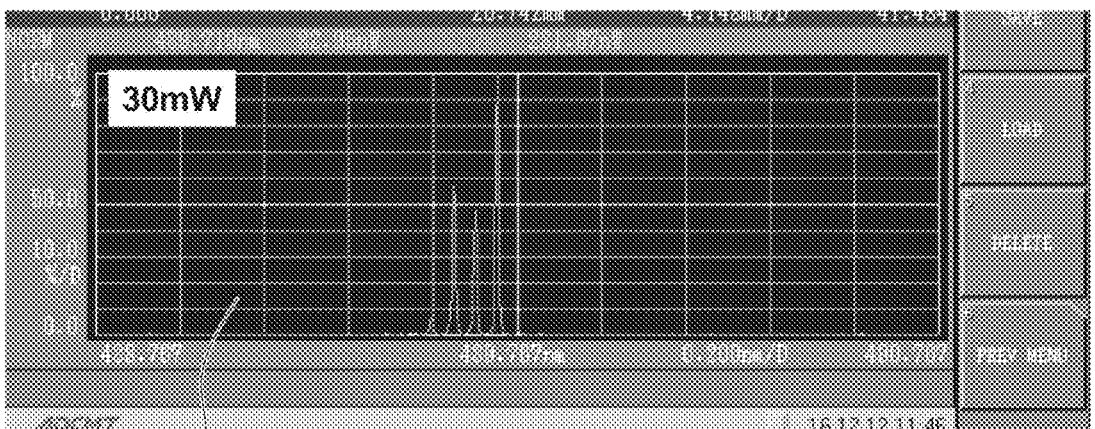
FIG. 24 shows optical spectrum of output light when the device shown in FIG. 21 was driven such that the optical output was 30 mW.
Figure 25:
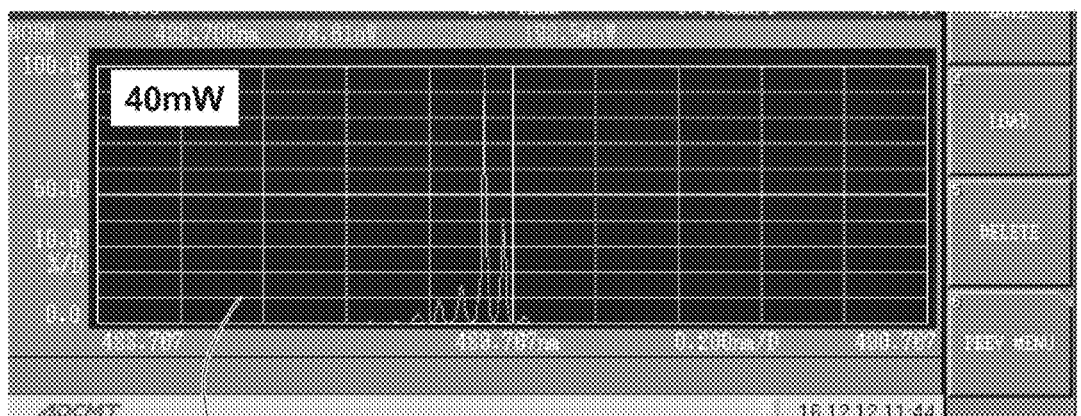
FIG. 25 shows optical spectrum of output light when the device shown in FIG. 21 was driven such that the optical output was 40 mW.
Figure 26:
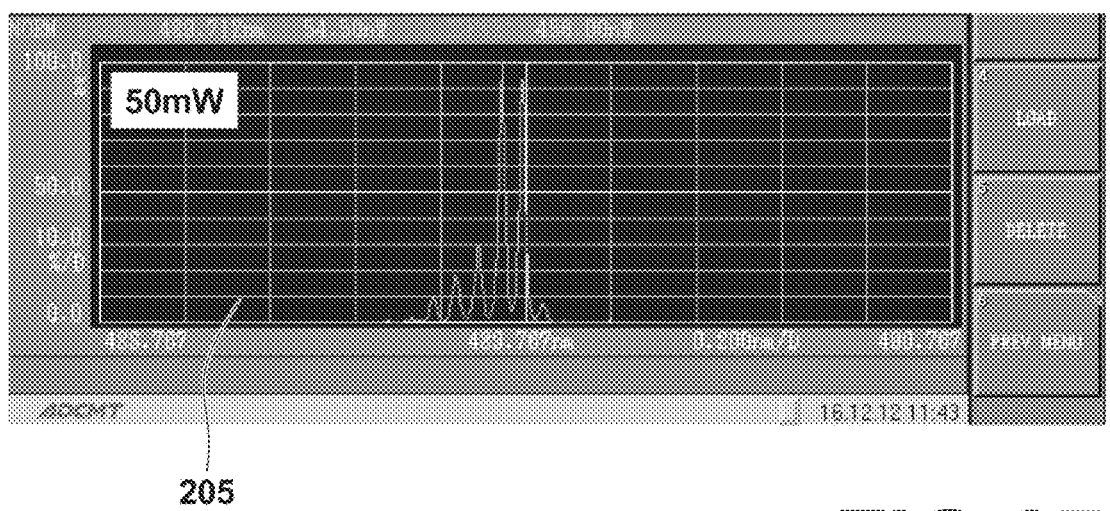
FIG. 26 shows optical spectrum of output light when the device shown in FIG. 21 was driven such that the optical output was 50 mW.
Figure 27:
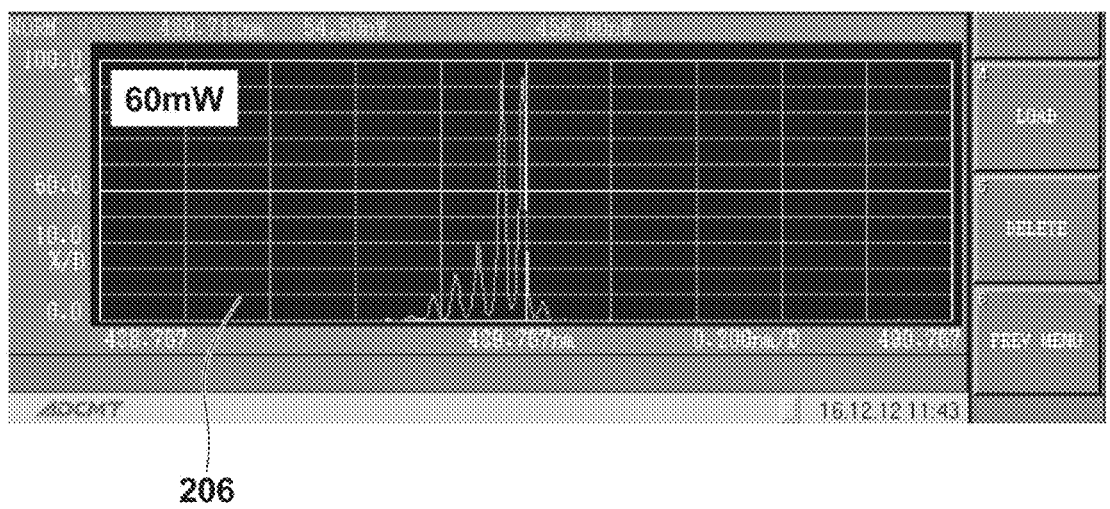
FIG. 27 shows optical spectrum of output light when the device shown in FIG. 21 was driven such that the optical output was 60 mW.
Figure 28:
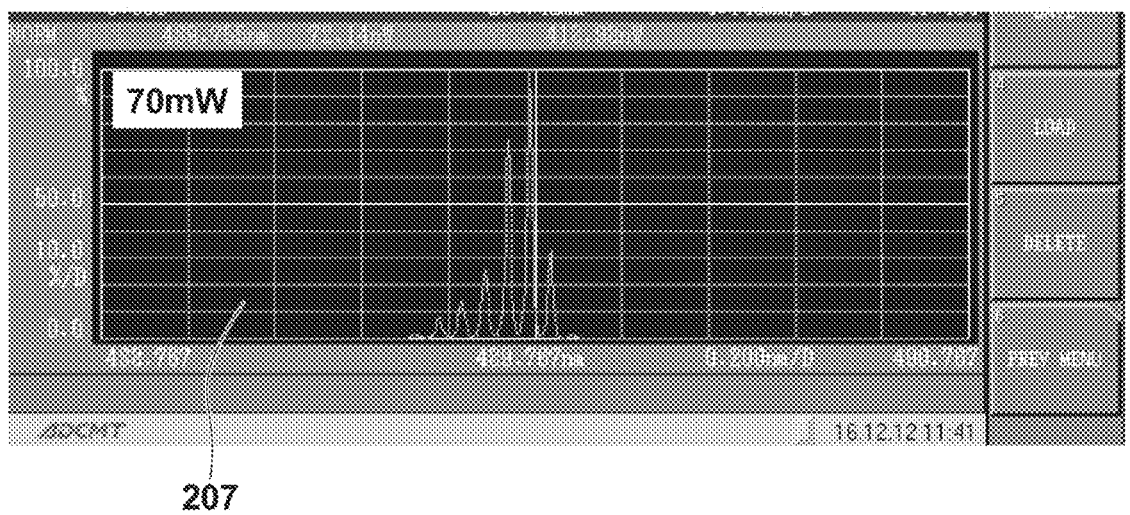
FIG. 28 shows optical spectrum of output light when the device shown in FIG. 21 was driven such that the optical output was 70 mW.
Figure 29:
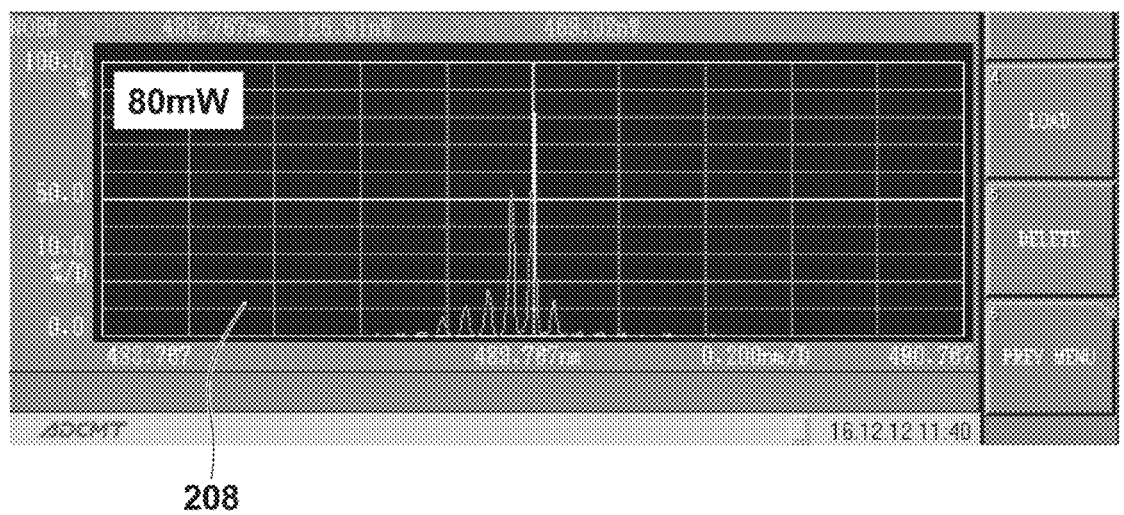
FIG. 29 shows optical spectrum of output light when the device shown in FIG. 21 was driven such that the optical output was 80 mW.

Next, a sixth embodiment of the disclosure is described. FIG. 21 is a diagram illustrating the schematic configuration of a semiconductor laser device with external resonator 6 according to the sixth embodiment of the disclosure. The difference between the semiconductor laser device with external resonator 6 of this embodiment and the semiconductor laser device with external resonator 1 shown in FIG. 1 basically lies in that, in the sixth embodiment, a confocal optical system is disposed in the optical path of the external resonator. This basic difference also applies to seventh and eighth embodiments, which will be described later.

Namely, in the sixth embodiment, the rear end face 11c of the semiconductor light-emitting element 11 (the end face farther from the resonator mirror 12) and the rear end face 12c of the resonator mirror 12 form the external resonator for resonating the light 10 emitted from the semiconductor light-emitting element 11. A confocal optical system, which includes the collimator lens 13 similar to the one described above and a condenser lens 61, is disposed in the optical path of the external resonator. The collimator lens 13 collimates the light 10 emitted from the semiconductor light-emitting element 11, and condenses the light 10 fed back from the resonator mirror 12 to the semiconductor light-emitting element 11 to focus the light 10 on the front end face (corresponding to "the other end face" as recited in the claims) 11b of the semiconductor light-emitting element 11. Further, the condenser lens 61 condenses and focuses the light 10 on the rear end face 12c of the resonator mirror 12, and collimates the light 10 reflected from the rear end face 12c. The light 10 transmitted through the rear end face 12c of the resonator mirror 12 and diverged is collimated by the collimator lens 62.

A narrow band pass filter 63, which is basically the same as the narrow band pass filter 14 shown in FIG. 1, is disposed in the optical path of the light 10 between the collimator lens 13 and the condenser lens 61. The operation and effect of the narrow band pass filter 63 are basically the same as those of the narrow band pass filter 14.

As described previously, the front end face 12b of the resonator mirror 12 may be provided with the partial reflection coating, and the front end face 12b and the rear end face 11c of the semiconductor light-emitting element 11 may form the external resonator. In this configuration, the light 10 is reflected at the front end face 12b of the resonator mirror 12 to resonate. The confocal optical system in this case is configured such that the condenser lens 61 condenses and focuses the light 10 on the front end face 12c. The confocal optical system having such a configuration is also applicable to seventh and eighth embodiments, which will be described later.

Further, in the sixth embodiment, the semiconductor light-emitting element 11 is driven with a drive current with a high-frequency wave superimposed thereon using the same configuration as that shown in FIG. 1. However, the configuration used to achieve the fast modulation drive of the semiconductor light-emitting element 11 is not limited to the configuration shown in FIG. 1, and any other configuration, such as one shown in FIG. 11, 13, 15, or 17, may be used. This point also applies to seventh and eighth embodiments, which will be described later.

The semiconductor light-emitting element 11 used in the sixth embodiment has a structure that does not resonate the light 10 emitted therefrom by itself, as one example. However, in the case where the above-described confocal optical system is provided, a semiconductor light-emitting element having a structure that resonates the light 10 emitted therefrom by itself may be used.

Next, with respect to the longitudinal mode of the semiconductor laser device with external resonator 6, one example of the device 6 is described. The semiconductor light-emitting element 11, the resonator mirror 12, and the narrow band pass filter 63 in this example have basically the same specifications as those of the previously described first embodiment (the narrow band pass filter 63 has basically the same specifications as those of the narrow band pass filter 14). The drive current used to drive the semiconductor light-emitting element 11 is a direct current with a high-frequency wave superimposed thereon, similarly to Example 1; however, the frequency of the high-frequency wave is 200 MHz in this example.

Each of FIGS. 22 to 29 shows optical spectrum of the output light 16 in each of the cases where the semiconductor light-emitting element 11 of the semiconductor laser device with external resonator 6 was driven with drive currents having eight different values (average values). Similarly to previously described FIG. 4, FIGS. 22 to 29 show photographs of the display screen of the optical spectrum analyzer. The screens 201, 202, 203, 204, 205, 206, 207, and 208 shown in FIGS. 22 to 29 show spectra in the cases where the drive current of the semiconductor light-emitting element 11 was changed such that the optical output of the semiconductor light-emitting element 11 was 10 mW, 20 mW, 30 mW, 40 mW, 50 mW, 60 mW, 70 mW, and 80 mW, respectively. On each screen, the horizontal axis indicates the wavelength and the vertical axis indicates the optical output (relative value). It can be seen from FIGS. 22 to 29 that, with the semiconductor laser device with external resonator 6, change of the optical spectrum of the output light 16 was small even when the optical output was changed between 10 mW and 80 mW.

Figure 30:
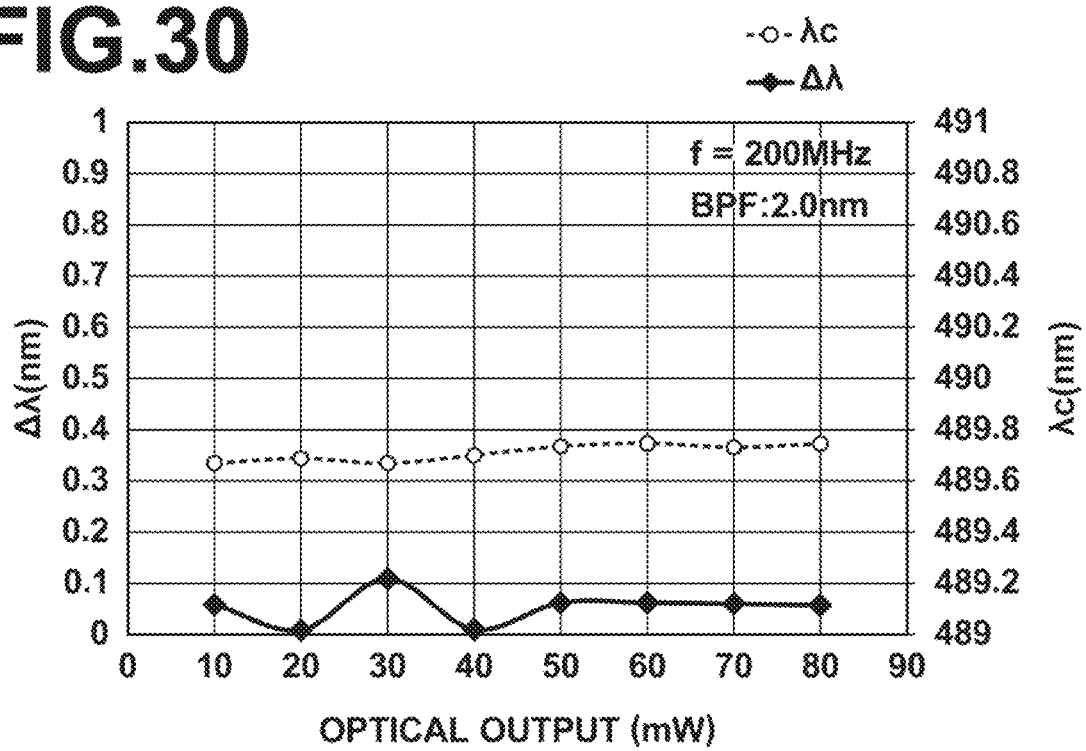
FIG. 30 is a graph showing the relationship among optical output, center wavelength, and wavelength width of output light when the device shown in FIG. 21 was driven with different drive currents.

FIG. 30 is a graph showing the center wavelength $\lambda c$, and the wavelength width $\Delta \lambda$ of each optical spectrum with the center wavelength $\lambda c$ of the output light 16 in the above-described eight cases. The manner of description of FIG. 30 is basically the same as that of FIG. 5 described previously. As shown in FIG. 30, variation of the center wavelength $\lambda c$ in this example was as small as around 0.1 nm even when the optical output was decreased or increased in the range from 10 mW to 80 mW. Also, variation of the wavelength width $\Delta \lambda$, (FWTM) was not more than around 0.15 nm, and thus the lasing wavelength was kept within a narrow wavelength range.

Figure 31:
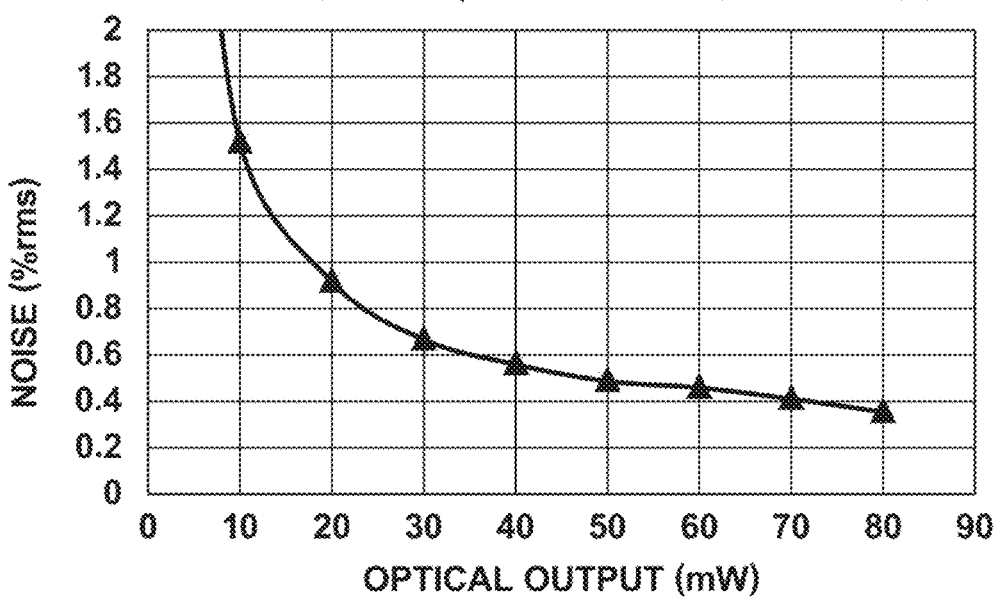
FIG. 31 is a graph showing the relationship between optical output and amount of noise of the device shown in FIG. 21.

Next, amount of noise in the above-described eight cases is described. FIG. 31 shows noise characteristics of the output light 16 in the above-described eight cases. The manner of description of FIG. 31 is basically the same as that of FIG. 9 described previously. The manner of measurement of the noise characteristics is also basically the same as that of the noise characteristics shown in FIG. 9. As shown in FIG. 31, with the semiconductor laser device with external resonator 6 of this example, variation of the noise is small even when the optical output is increased or decreased between 10 mW and 80 mW, and the ratio of noise to the optical output converges to a value as small as 0.4% rms.

Next, results of measurement of the coherent length Lc in seven cases of the above-described eight cases, other than the case where the optical output was 10 mW, is described with reference to FIGS. 32 to 38. In this measurement, the output light 16 from the semiconductor laser device with external resonator 6 is branched into two paths, the intensity of coherence between the branched two paths of the output light 16 is found, and the coherent length Lc is found based on the intensity of coherence.

Figure 32:
FIG. 32 shows the intensity of coherence and coherent length when the device shown in FIG. 21 was driven such that the optical output was 20 mW.
Figure 33:
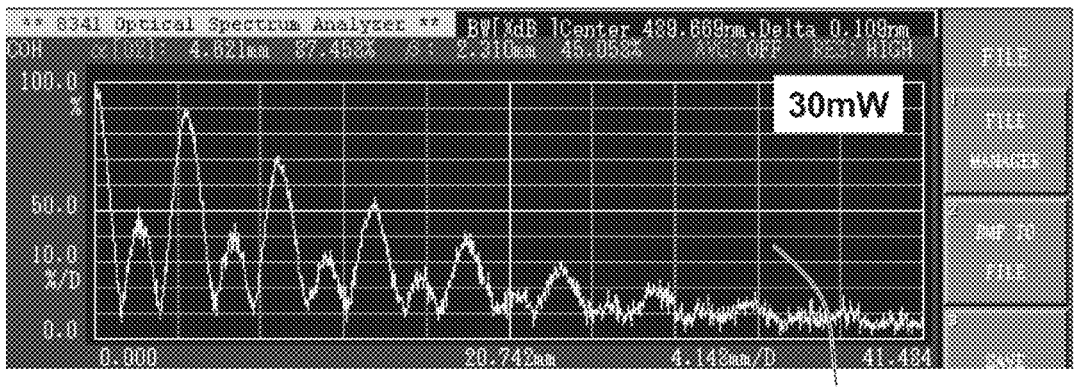
FIG. 33 shows the intensity of coherence when the device shown in FIG. 21 was driven such that the optical output was 30 mW.
Figure 34:
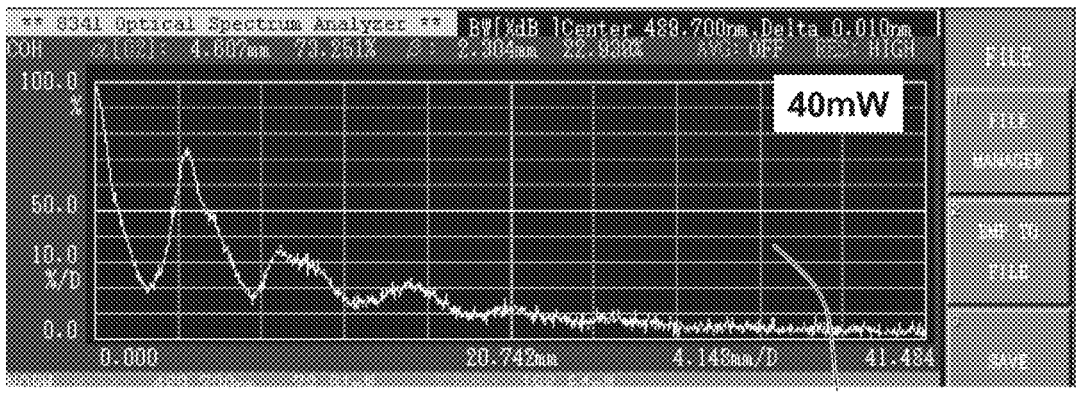
FIG. 34 shows the intensity of coherence when the device shown in FIG. 21 was driven such that the optical output was 40 mW.
Figure 35:
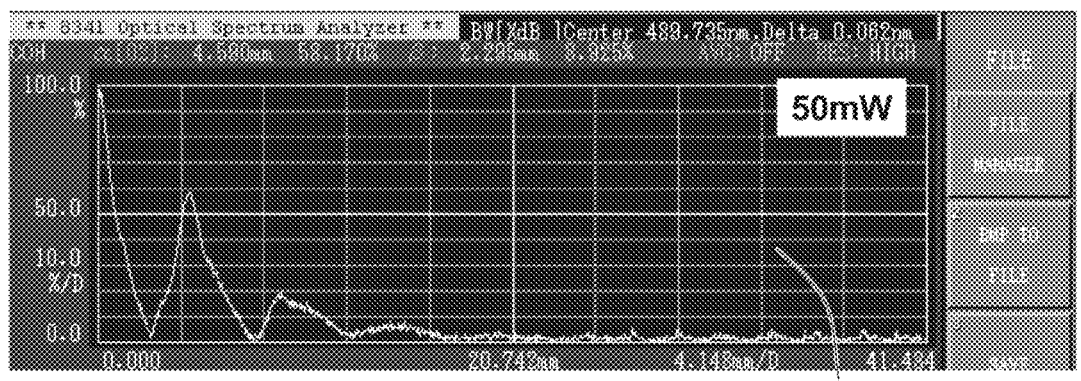
FIG. 35 shows the intensity of coherence when the device shown in FIG. 21 was driven such that the optical output was 50 mW.
Figure 36:
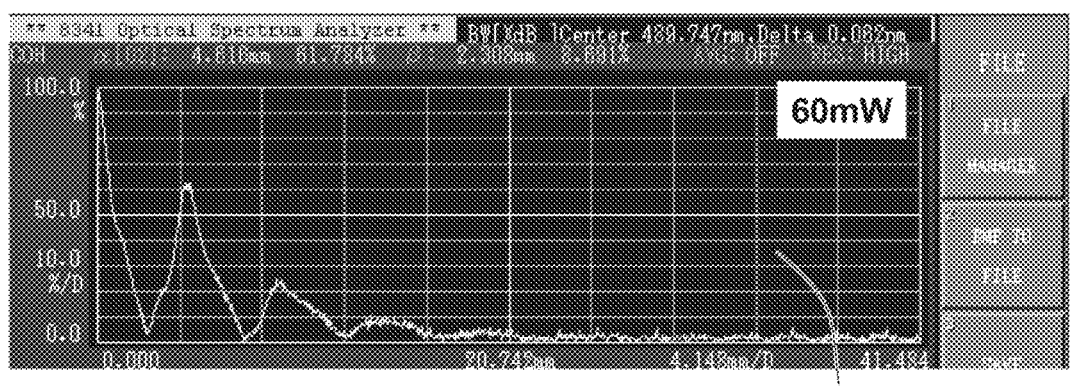
FIG. 36 shows the intensity of coherence when the device shown in FIG. 21 was driven such that the optical output was 60 mW.
Figure 37:
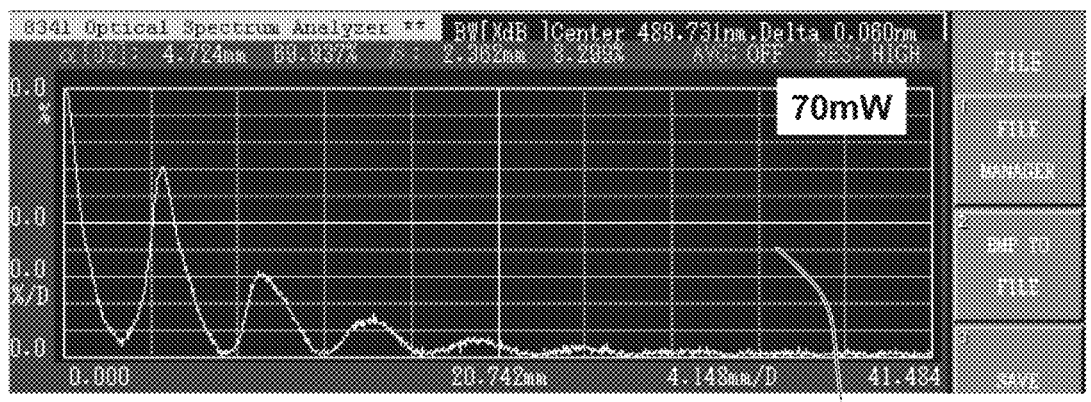
FIG. 37 shows the intensity of coherence when the device shown in FIG. 21 was driven such that the optical output was 70 mW.
Figure 38:
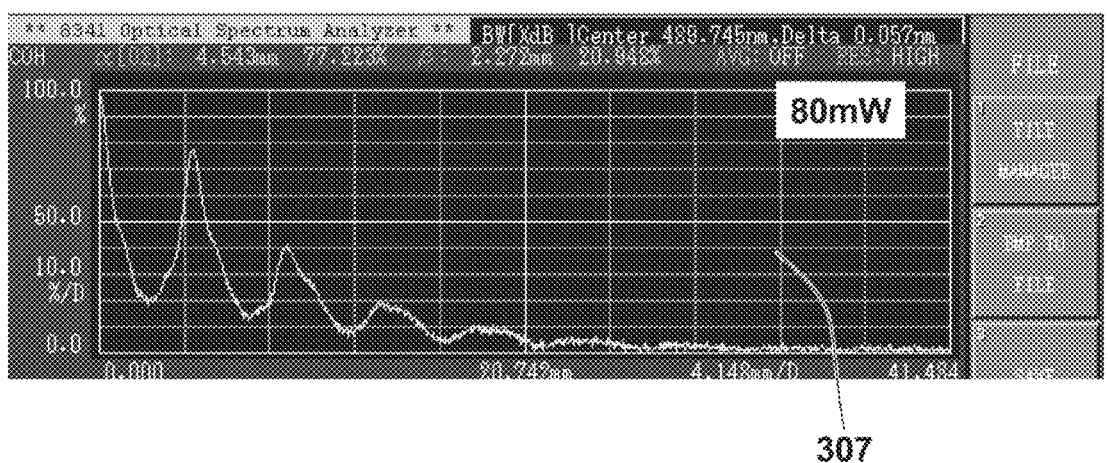
FIG. 38 shows the intensity of coherence when the device shown in FIG. 21 was driven such that the optical output was 80 mW.

FIGS. 32 to 38 shows photographs of the display screen of the interferometer used to find the intensity of coherence. Screens 301, 302, 303, 304, 305, 306, and 307 respectively shown in these photographs show the results of the measurement of the intensity of coherence in the cases where the drive current of the semiconductor light-emitting element 11 was changed such that the optical output of the semiconductor light-emitting element 11 was 20 mW, 30 mW, 40 mW, 50 mW, 60 mW, 70 mW, and 80 mW, respectively. On each screen, the vertical axis indicates the intensity of coherence (relative value), and the horizontal axis indicates the distance between two ports that detect the two paths of the output light 16 (this distance corresponds to the difference of optical path length between the two paths of the output light 16). The distance between the ports is 0 at the left end of the horizontal axis, and is 41 mm at the right end of the horizontal axis. As shown in FIG. 32, an envelope of the signals indicating the intensities of coherence is found, and a distance between the ports at which the intensity of coherence along the envelope is 20% of the maximum value is defined as the coherent length Lc.

As shown in FIGS. 32 to 38, with the semiconductor laser device with external resonator 6 of this example, the coherent length Lc is kept to a small value within the range from about 20 mm to 12 mm when the optical output is within the range from 20 mW to 80 mW.

As described previously, the confocal optical system provides the effect of selecting the wavelength range of light to resonate, similarly to the wavelength control element. An experiment to confirm this effect was conducted using convex lenses having a focal length of 2.4 mm, 4.0 mm, and 6.2 mm, respectively, as the condenser lens 61 (see FIG. 21) forming the confocal optical system. From the results of the experiment, the effect of selecting the wavelength range was confirmed for all of the above lenses. In general, a lens having a shorter focal length provides a higher effect of selecting the wavelength range. The higher the effect, the smaller the variations of the center wavelength λc and the wavelength width Δλ relative to increase or decrease of the drive current of the semiconductor light-emitting element.

Seventh Embodiment

Figure 39:
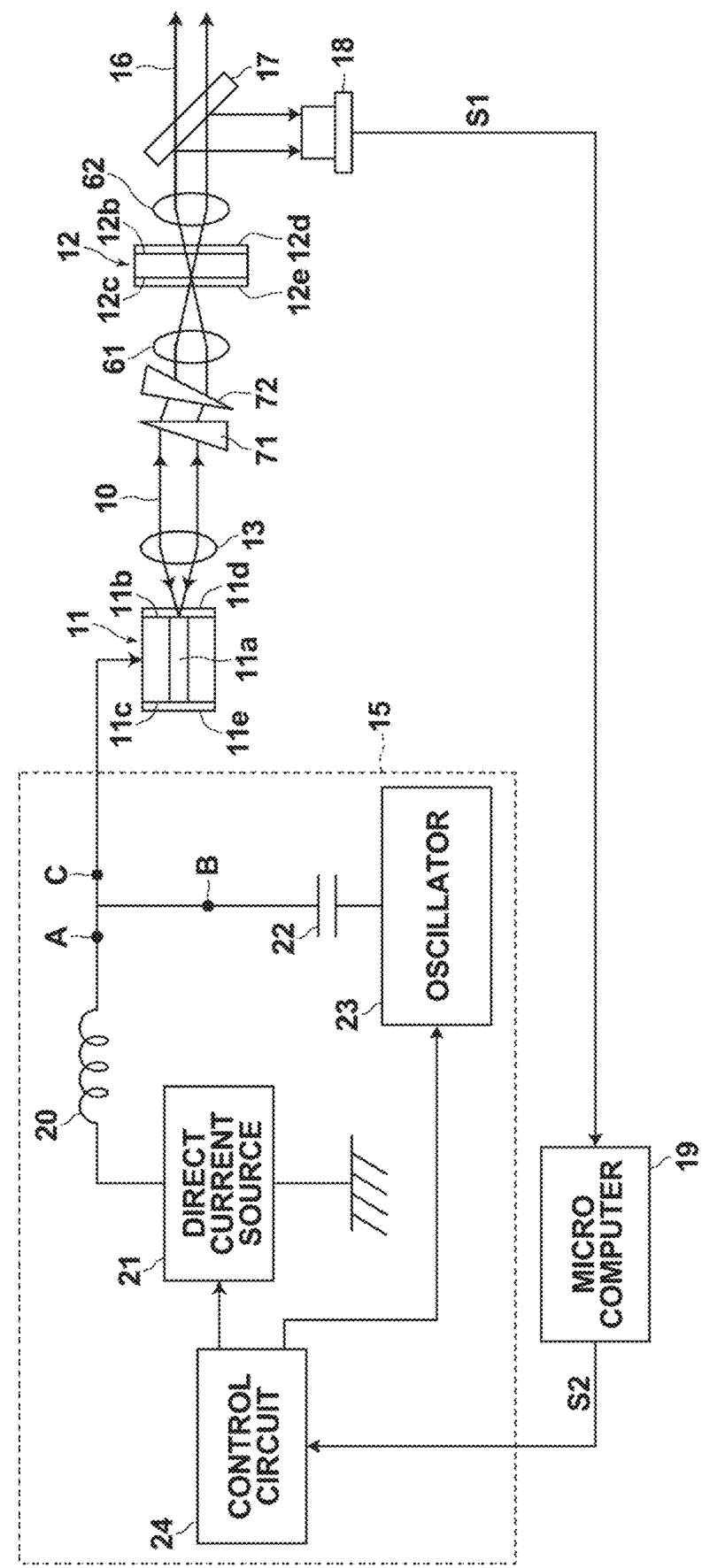
FIG. 39 is a diagram illustrating the schematic configuration of a semiconductor laser device with external resonator according to a seventh embodiment of the disclosure.

Next, a seventh embodiment of the disclosure is described. FIG. 39 is a diagram illustrating the schematic configuration of a semiconductor laser device with external resonator 7 according to a seventh embodiment of the disclosure. The difference between the semiconductor laser device with external resonator 7 of this embodiment and the semiconductor laser device with external resonator 6 shown in FIG. 21 basically lies in that, in the seventh embodiment, two prisms 71 and 72 are provided as the wavelength control element, in place of the narrow band pass filter 63. The two prisms 71 and 72 form a so-called anamorphic prism pair. The effect as the wavelength control element of the prisms 71 and 72 is basically the same as the effect of the narrow band pass filter 63.

Figure 40:
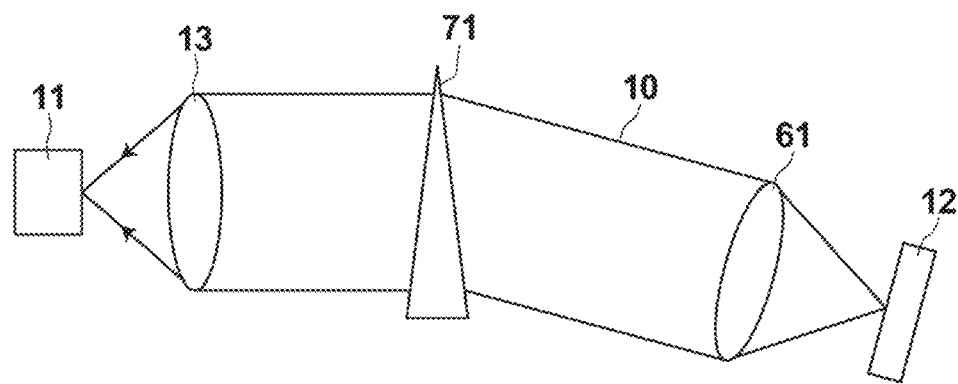
FIG. 40 is a schematic diagram for explaining characteristics of a prism pair.

It should be noted that the effect as the wavelength control element can also be obtained when only one prism 71 is used, as shown in FIG. 40. However, when the anamorphic prism pair is used, an incoming beam of light 10 having an elliptical beam shape can be outputted as an outgoing beam of light 10 also having a circular beam shape. Thus, if it is desired that the output beam of light 16 have a circular beam shape, it is preferred to use the anamorphic prism pair. Further, as is apparent from comparison between FIG. 40 and FIG. 39, when only one prism 71 is used, the direction of travel of the light 10 is deflected. In contrast, when the anamorphic prism pair is used, the direction of travel of the light 10 can be aligned parallel.

Figure 41:
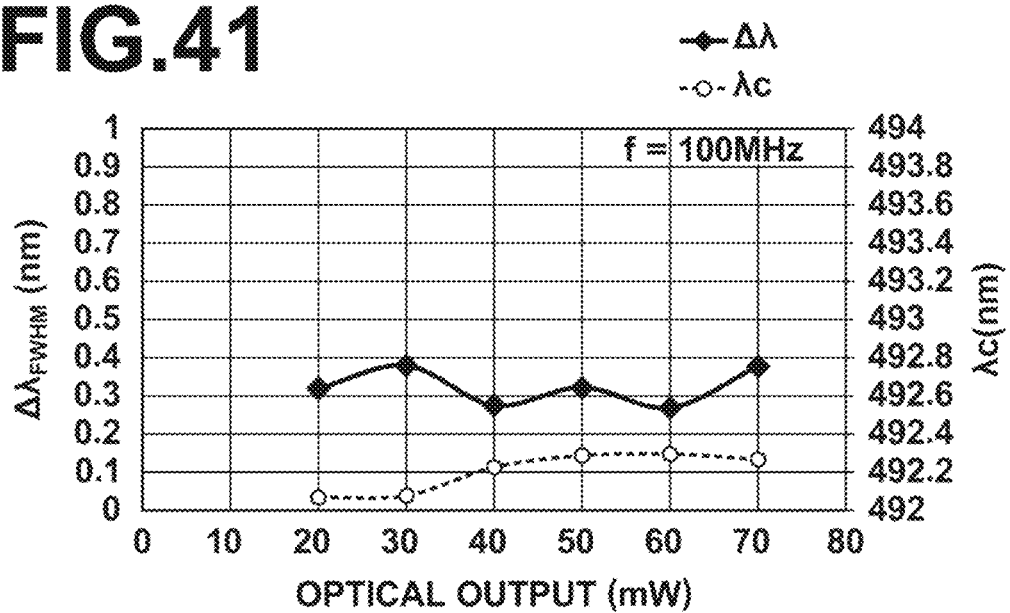
FIG. 41 is a graph showing the relationship among optical output, center wavelength, and wavelength width of output light when the device shown in FIG. 39 was driven with different drive currents.

FIG. 41 is a graph showing the center wavelength λc, and the wavelength width Δλ (FWHM) of each optical spectrum with the center wavelength λc of the output light 16 in the cases where the drive current of the semiconductor light-emitting element 11 was changed in six different manners such that the optical output of the semiconductor light-emitting element 11 was 20 mW, 30 mW, 40 mW, 50 mW, 60 mW, and 70 mW. The manner of description of FIG. 41 is basically the same as that of FIG. 5 described previously. As shown in FIG. 41, variation of the center wavelength λc in this example was as small as around 0.2 nm even when the optical output was decreased or increased in the range from 20 mW to 70 mW. Also, variation of the wavelength width Δλ (FWTM) was not more than around 0.11 nm, and thus the lasing wavelength was kept within a narrow wavelength range.

Now, a specific example of the prism serving as the wavelength control element is described. First, the anamorphic prism pair is described. The anamorphic prism pair was formed using two identical prisms made of a glass material SF10 and having an apex angle of 27.5°. An angular dispersion of 45 μrad/nm (an amount of refraction angle per nanometer of wavelength) was achieved by setting an optical path including different angles of incidence onto the first and second prisms. The prism pair having this angular dispersion was disposed within the resonator to obtain the semiconductor laser device with external resonator 7 having the configuration as shown in FIG. 39, and the experiments that provided the previously described results shown in FIG. 41, etc., were conducted.

Since the output angle from the prism varies depending on the wavelength of the light transmitted through the prism, the wavelength of light to resonate in the external resonator can be determined by configuring the external resonator such that only light outputted at a predetermined output angle is resonated. Further, in the case where the prism pair is used, an angular dispersion different from the above-described angular dispersion can be imparted to the prism pair by changing a relative angle between the first prism and the second prism. Still further, a desired angular dispersion can be obtained by, for example, forming the first prism and the second prism using different glass materials, such as SF10 for the first prism and BK7 for the second prism.

Next, an example where only one prism is used, as shown in FIG. 40, is described. An angular dispersion of 66 μrad/nm was achieved by using a prism made of a glass material BK7 and having an apex angle of 30°. The advantageous effects of the disclosure were also achieved when this prism was used to form the external resonator as shown in FIG. 39.

Eighth Embodiment

Figure 42:
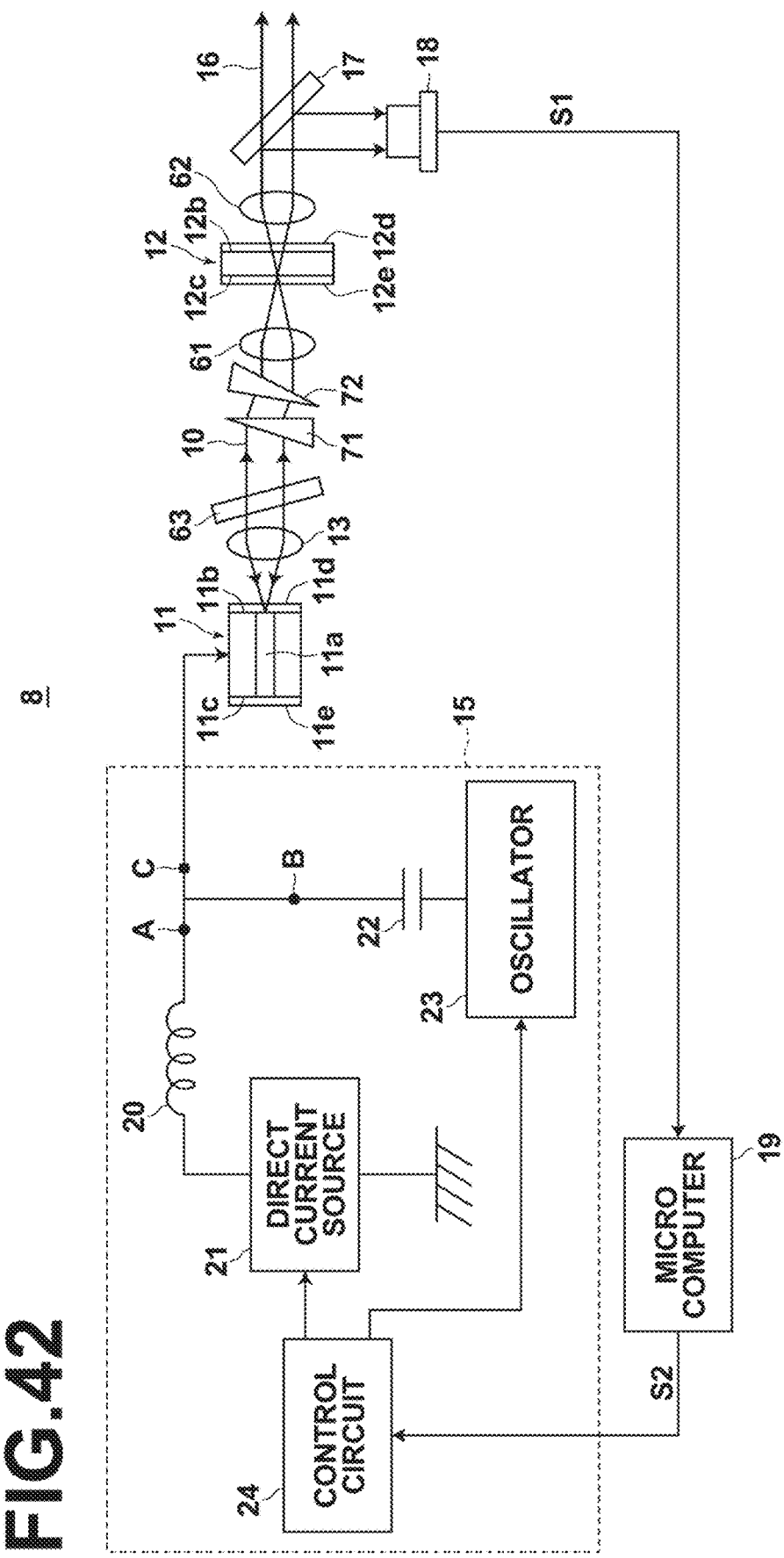
FIG. 42 is a diagram illustrating the schematic configuration of a semiconductor laser device with external resonator according to an eighth embodiment of the disclosure.

Next, an eighth embodiment of the disclosure is described. FIG. 42 is a diagram illustrating the schematic configuration of a semiconductor laser device with external resonator 8 according to the eighth embodiment of the disclosure. The difference between the semiconductor laser device with external resonator 8 of this embodiment and the semiconductor laser device with external resonator 6 shown in FIG. 21 basically lies in that, in the eighth embodiment, two prisms 71 and 72 are provided as the wavelength control element in addition to the narrow band pass filter 63. These two prisms 71 and 72 are basically the same as those shown in FIG. 39. In the configuration shown in FIG. 42, both the anamorphic prism pair formed by the prisms 71 and 72 and the narrow band pass filter 63 function as the wavelength control element.

Figure 43:
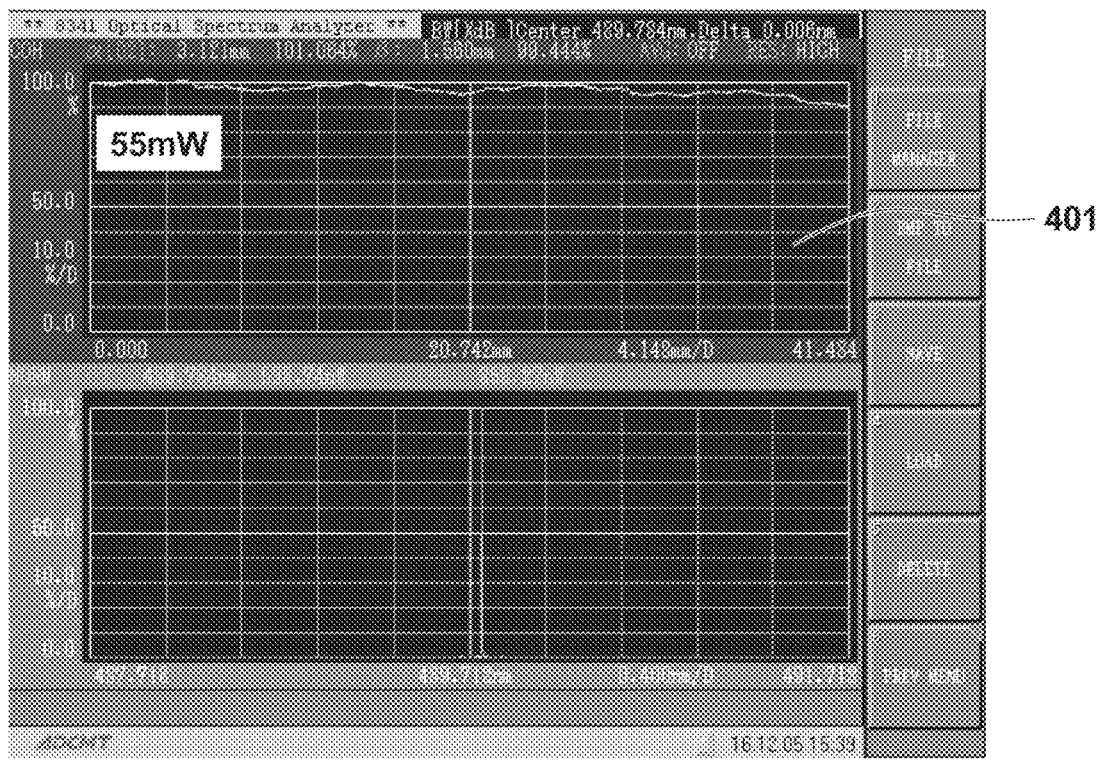
FIG. 43 shows coherent length and optical spectrum of output light of a semiconductor laser device with external resonator, which is a comparative example to the device shown in FIG. 42.
Figure 44:
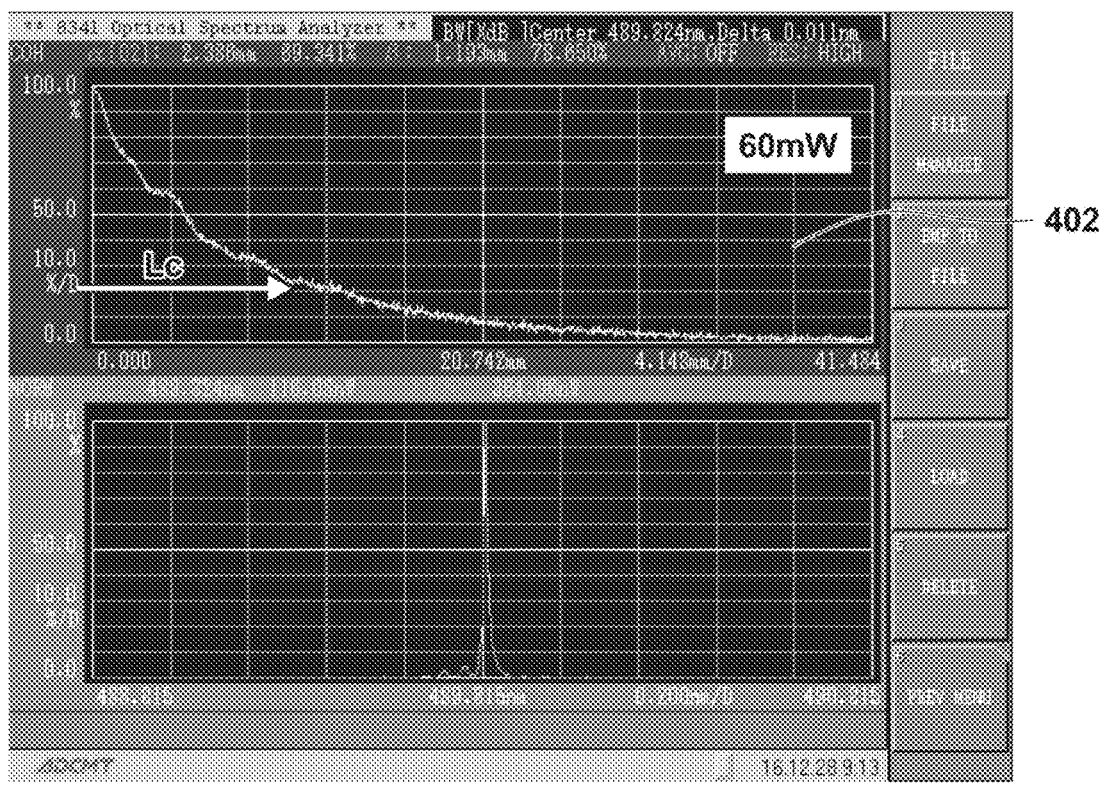
FIG. 44 shows coherent length and optical spectrum of output light of the device shown in FIG. 42.

Now, the coherence and the longitudinal mode characteristics of the semiconductor laser device with external resonator 8 of the eighth embodiment are described with reference to FIGS. 43 and 44. Each of FIGS. 43 and 44 shows, at the upper portion, a photograph of the display screen of the interferometer, similarly to the previously described FIGS. 32 to 38, and shows, at the lower portion, a photograph of the display screen of the optical spectrum analyzer, similarly to the previously described FIG. 4. The screens shown in FIG. 43 are denoted by "401", and the screens shown in FIG. 44 are denoted by "402".

FIG. 44 shows the results of measurement of one example of the semiconductor laser device with external resonator 8 shown in FIG. 42. In this example, the semiconductor light-emitting element 11 is driven with a current with a high-frequency wave having a frequency of 200 MHz superimposed thereon. The optical output in this example is 60 mW. On the other hand, FIG. 43 shows the results of measurement of a semiconductor laser device with external resonator which is a comparative example to the semiconductor laser device with external resonator 8. In this comparative example, the semiconductor light-emitting element 11 is driven with a direct current. The optical output in this comparative example is 55 mW. As the narrow band pass filter 63, one having a transmission width $\Delta\lambda f$ (see FIG. 2) of 1.0 nm is used in each example.

In both the two examples, the longitudinal mode of the laser is single mode. In FIG. 44, the coherent length is denoted by "Lc" on the screen 402, and the coherent length Lc=12 mm. The definition of the coherent length Lc is the same as the definition described previously with reference to FIG. 32. In contrast, the coherent length Lc of the comparative example, the results of measurement of which is shown in FIG. 43, exceeds 41 mm (the previously described distance between the two ports that detects the output light), and is estimated to be several hundred millimeters or more.

It should be noted that, in a case where the laser device is applied to a measurement light source of a precision position detector, or the like, it is desirable to set the coherent length Lc to a value that is preferred to minimize the coherency, such as less than 40 mm. In order to set a coherent length Lc of less than 40 mm, it is generally desirable to set a modulation factor above 80%, for example. In the first embodiment, for example, as shown at C in FIG. 3, the modulation factor is 100%. If the modulation factor is 80% or less, the relative amount of the direct current component in the drive current increases, which generally results in a long coherent length Lc of 40 mm or more. In this case, the coherency of the semiconductor laser device with external resonator is increased, leading to performance degradation of the device. It should be noted that the modulation factor=the modulation component in the drive current/(the direct current component in the drive current+the modulation component in the drive current).

As described above, with the semiconductor laser device with external resonator 8 according to the disclosure, which employs the same optical system for resonating light as that of the comparative example, both the single longitudinal mode lasing and the short coherent length are achieved. A typical laser has such characteristics that the coherent length is relatively long during the single longitudinal mode lasing, and the coherent length is shorter during the multiple longitudinal mode lasing. In contrast, with the semiconductor laser device with external resonator 8 according to the disclosure, two characteristics including the incoherency with short coherent length and the single longitudinal mode lasing can be obtained at the same time. Thus, the semiconductor laser device with external resonator 8 according to the disclosure is applicable to a wide range of applications in the field of measurement instruments, etc.

The semiconductor light-emitting element 11 of the semiconductor laser device with external resonator 8 of the above-described example was driven with each of drive currents having six different values (average values) of 10 mW, 20 mW, 30 mW, 40 mW, 50 mW, and 60 mW. FIG. 45 is a graph showing the center wavelength $\lambda c$ and the wavelength width $\Delta\lambda$ (FWTM) of each optical spectrum with the center wavelength $\lambda c$ of the output light 16 in these cases. The manner of description of FIG. 45 is basically the same as that of FIG. 5 described previously. As shown in FIG. 45, variation of the center wavelength $\lambda c$ in this example was as small as around 0.1 nm even when the optical output was decreased or increased in the range from 10 mW to 60 mW. Also, variation of the wavelength width $\Delta\lambda$ (FWTM) was not more than around 0.1 nm, and thus the lasing wavelength was kept within a narrow wavelength range. As described above, in the semiconductor laser device with external resonator 8, both the anamorphic prism pair formed by the prisms 71 and 72 and the narrow band pass filter 63 function as the wavelength control element, and this allows achieving even smaller variations of the center wavelength $\lambda c$ and the wavelength width $\Delta\lambda$.

What is claimed is:

1. A semiconductor laser device with external resonator from which a laser light is emitted, the semiconductor laser device comprising:
    a semiconductor light-emitting element having a pair of end faces with a light emitting section disposed therebetween, the semiconductor light-emitting element having a structure which does not oscillate light emitted therefrom by itself;
    an external resonator comprising a resonator mirror disposed outside the semiconductor light-emitting element and one of the pair of end faces that is farther from the resonator mirror, the external resonator being configured to oscillate the light emitted from the semiconductor light-emitting element;
    a wavelength control element disposed in the optical path within the external resonator, and configured to select a wavelength range of the light; and
    a driver circuit configured to perform fast modulation drive of the semiconductor light-emitting element,
    wherein variation of the center wavelength $\lambda c$ of the laser light is not more than 0.2 nm, variation of wavelength width $\Delta\lambda$ of the laser light is not more than 0.11 nm relative to increase or decrease of the optical output of the laser light, and a coherent length Lc is not more than 40 mm.

2. The semiconductor laser device with external resonator as claimed in claim 1, wherein the driver circuit is configured to apply a drive current to the semiconductor light-emitting element, the drive current comprising a direct current with a high-frequency wave superimposed thereon.

3. The semiconductor laser device with external resonator as claimed in claim 2, wherein the laser light is subjected to an intensity modulation by the driver circuit, the driver circuit controlling both intensity of the direct current and the high-frequency wave.

4. The semiconductor laser device with external resonator as claimed in claim 1, wherein a modulation factor is in a range from 80% to 100%.

5. The semiconductor laser device with external resonator as claimed in claim 1, wherein the driver circuit is configured to apply a pulsed drive current with alternately repeating on-periods and off-periods to the semiconductor light-emitting element.

6. The semiconductor laser device with external resonator as claimed in claim 5, wherein the laser light is subjected to an intensity modulation by the driver circuit, the driver circuit controlling the intensity of the pulsed drive current.

7. The semiconductor laser device with external resonator as claimed in claim 1, wherein the optical output of the laser light is increased or decreased between a maximum value of the optical output and a minimum value thereof, the minimum value being 2/7 of the maximum value.

8. The semiconductor laser device with external resonator as claimed in claim 1, wherein a longitudinal mode is a single mode.

9. The semiconductor laser device with external resonator as claimed in claim 1, wherein the wavelength control element comprises a transmissive and narrow band pass filter.

10. The semiconductor laser device with external resonator as claimed in claim 9, wherein a full width at half maximum of the filter element is not more than 5.0 nm.

11. The semiconductor laser device with external resonator as claimed in claim 1, wherein the semiconductor light-emitting element comprises a nitride semiconductor light-emitting element configured to emit light of a wavelength in the range from 370 nm to 530 nm.

12. A semiconductor laser device with external resonator from which a laser light is emitted, the semiconductor laser device comprising:
- a semiconductor light-emitting element having a pair of end faces with a light emitting section disposed therebetween, the semiconductor light-emitting element having a structure which does not oscillate light emitted therefrom by itself;
- an external resonator comprising a resonator mirror disposed outside the semiconductor light-emitting element and one of the pair of end faces that is farther from the resonator mirror, the external resonator being configured to oscillate the light emitted from the semiconductor light-emitting element;
- a confocal optical system disposed in the optical path of the external resonator, and configured to focus the light on the other of the pair of end faces that is nearer to the resonator mirror, and on a reflecting surface of the resonator mirror;
- a wavelength control element disposed in the optical path within the external resonator, and configured to select a wavelength range of the light; and
- a driver circuit configured to perform fast modulation drive of the semiconductor light-emitting element,
wherein variation of the center wavelength $\lambda c$ of the laser light is not more than 0.2 nm, variation of wavelength width $\Delta\lambda$ of the laser light is not more than 0.11 nm relative to increase or decrease of the optical output of the laser light, and a coherent length Lc is not more than 40 mm.

13. The semiconductor laser device with external resonator as claimed in claim 12, wherein the driver circuit is configured to apply a drive current to the semiconductor light-emitting element, the drive current comprising a direct current with a high-frequency wave superimposed thereon.

14. The semiconductor laser device with external resonator as claimed in claim 13, wherein the laser light is subjected to an intensity modulation by the driver circuit, the driver circuit controlling both intensity of the direct current and the high-frequency wave.

15. The semiconductor laser device with external resonator as claimed in claim 12, wherein a modulation factor is in a range from 80% to 100%.

16. The semiconductor laser device with external resonator as claimed in claim 12, wherein the driver circuit is configured to apply a pulsed drive current with alternately repeating on-periods and off-periods to the semiconductor light-emitting element.

17. The semiconductor laser device with external resonator as claimed in claim 16, wherein the laser light is subjected to an intensity modulation by the driver circuit, the driver circuit controlling the intensity of the pulsed drive current.

18. The semiconductor laser device with external resonator as claimed in claim 12, wherein the optical output of the laser light is increased or decreased between a maximum value of the optical output and a minimum value thereof, the minimum value being 2/7 of the maximum value.

19. The semiconductor laser device with external resonator as claimed in claim 12, wherein the wavelength control element comprises a transmissive and narrow band pass filter.

20. The semiconductor laser device with external resonator as claimed in claim 19, wherein a full width at half maximum of the filter element is not more than 5.0 nm.

21. The semiconductor laser device with external resonator as claimed in claim 12, wherein the semiconductor light-emitting element comprises a nitride semiconductor light-emitting element configured to emit light of a wavelength in the range from 370 nm to 530 nm.

* * * * *